(12) United States Patent
Kim et al.

(10) Patent No.: US 10,586,797 B2
(45) Date of Patent: Mar. 10, 2020

(54) VERTICAL MEMORY DEVICE AND METHOD OF FABRICATING THE SAME

(71) Applicant: SAMSUNG ELECTRONICS CO., LTD., Suwon-si, Gyeonggi-do (KR)

(72) Inventors: Kyoung-hoon Kim, Seoul (KR); Hong-soo Kim, Seongnam-si (KR)

(73) Assignee: SAMSUNG ELECTRONICS CO., LTD., Suwon-si, Gyeonggi-do (KR)

( * ) Notice: Subject to any disclaimer, the term of this patent is extended or adjusted under 35 U.S.C. 154(b) by 21 days.

(21) Appl. No.: 15/486,681

(22) Filed: Apr. 13, 2017

(65) Prior Publication Data
US 2018/0053768 A1 Feb. 22, 2018

(30) Foreign Application Priority Data

Aug. 18, 2016 (KR) .................. 10-2016-0104982

(51) Int. Cl.
| | |
|---|---|
| *H01L 27/115* | (2017.01) |
| *H01L 27/105* | (2006.01) |
| *H01L 27/11573* | (2017.01) |
| *H01L 27/11575* | (2017.01) |
| *H01L 27/11582* | (2017.01) |
| *G11C 16/08* | (2006.01) |
| *G11C 16/28* | (2006.01) |
| *H01L 23/528* | (2006.01) |
| *H01L 29/78* | (2006.01) |

(Continued)

(52) U.S. Cl.
CPC .......... *H01L 27/1052* (2013.01); *G11C 16/08* (2013.01); *G11C 16/28* (2013.01); *H01L 23/5283* (2013.01); *H01L 27/11573* (2013.01); *H01L 27/11575* (2013.01); *H01L 27/11582* (2013.01); *H01L 29/7827* (2013.01); *G11C 16/0483* (2013.01); *H01L 27/11565* (2013.01)

(58) Field of Classification Search
CPC ............ H01L 27/11582; H01L 23/528; H01L 21/76801; H01L 23/544; H01L 23/5226; H01L 21/31105; H01L 27/11556; H01L 27/11565; H01L 27/11519; H01L 22/20; H01L 2223/54426
See application file for complete search history.

(56) References Cited

U.S. PATENT DOCUMENTS

| | | |
|---|---|---|
| 6,794,238 B2 | 9/2004 | Lane et al. |
| 8,378,406 B2 | 2/2013 | Katsumata et al. |

(Continued)

*Primary Examiner* — Cuong B Nguyen
*Assistant Examiner* — Samuel Park
(74) *Attorney, Agent, or Firm* — Lee IP Law, P.C.

(57) ABSTRACT

A vertical memory device includes a substrate with a cell array region, a word line contact region, and a peripheral circuit region, gate electrodes parallel to the substrate in the cell array and word line contact regions, the gate electrodes being stacked and spaced apart in a direction perpendicular to the substrate, a channel structure through the gate electrodes in the cell array region, the channel structure being electrically connected to the substrate, a dummy channel structure through the gate electrodes in the word line contact region, the dummy channel structure being spaced apart from the substrate, and a conductive line parallel to the substrate and electrically connected to a first gate electrode, the conductive line crossing at least a portion of an extension of the dummy channel structure in the perpendicular direction.

20 Claims, 30 Drawing Sheets

(51) Int. Cl.
    *G11C 16/04*         (2006.01)
    *H01L 27/11565*      (2017.01)

(56)                References Cited

U.S. PATENT DOCUMENTS

| | | | |
|---|---|---|---|
| 8,680,604 | B2 | 3/2014 | Higashi et al. |
| 8,895,393 | B2 | 11/2014 | Sim et al. |
| 9,224,747 | B2 | 12/2015 | Mizutani et al. |
| 2015/0279852 | A1* | 10/2015 | Mizutani ........... H01L 27/11556 257/315 |
| 2016/0049423 | A1 | 2/2016 | Yoo et al. |
| 2017/0053932 | A1* | 2/2017 | Jeon .................. H01L 27/11582 |
| 2017/0179151 | A1* | 6/2017 | Kai ................... H01L 27/11524 |

\* cited by examiner

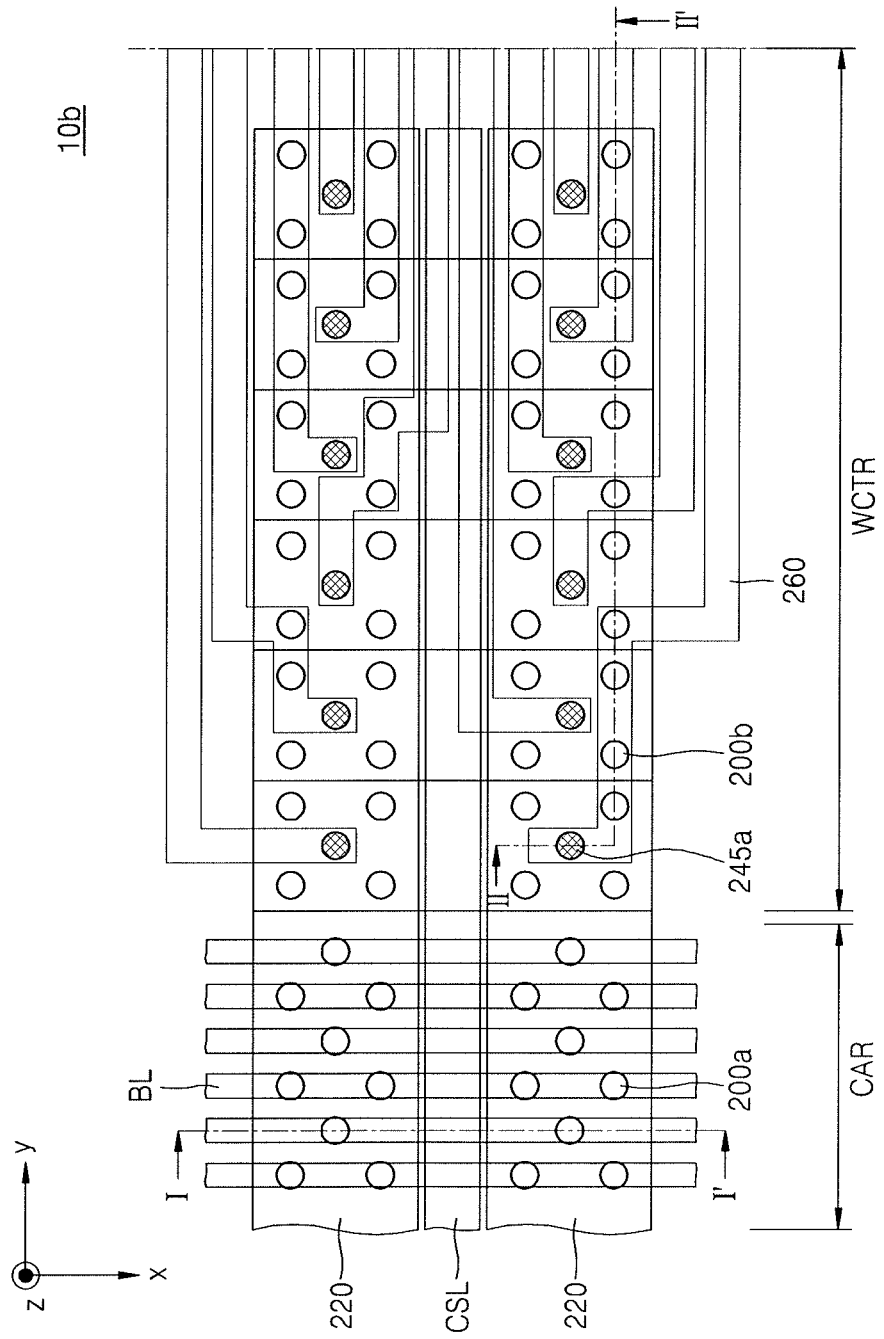

VERTICAL MEMORY DEVICE AND METHOD OF FABRICATING THE SAME

CROSS-REFERENCE TO RELATED APPLICATION

Korean Patent Application No. 10-2016-0104982, filed on Aug. 18, 2016, in the Korean Intellectual Property Office, and entitled: "Vertical Memory Device and Method of Fabricating the Same," is incorporated by reference herein in its entirety.

BACKGROUND

1. Field

Embodiments relate to a memory device and a method of fabricating the same, and more particularly, to a vertical memory device and a method of fabricating the same.

2. Description of the Related Art

Consumers demand memory devices having excellent performance and low prices. To this end, there is a need to increase the integration degree of memory devices. Recently, vertical memory devices, in which memory cells are vertically stacked on a substrate, are being developed to produce highly integrated memory devices.

SUMMARY

According to embodiments, there is provided a vertical memory device including a substrate including a cell array region, a word line contact region, and a peripheral circuit region, gate electrodes configured to extend substantially parallel to a top surface of the substrate in the cell array region and the word line contact region and to be stacked while being spaced apart from one another in a first direction, wherein the first direction is a direction that is substantially perpendicular to the top surface of the substrate, a channel structure configured to pass through the gate electrodes in the first direction in the cell array region and to be electrically connected to the substrate, a dummy channel structure configured to pass through the gate electrodes in the word line contact region in the first direction and to be spaced apart from the substrate in the first direction, and a conductive line configured to be substantially parallel to the top surface of the substrate in the peripheral circuit region and the word line contact region and to be electrically connected to a first gate electrode, which is any one of the gate electrodes, wherein the conductive line crosses at least a portion of an extension of the dummy channel structure in the first direction.

According to other embodiments, there is provided a vertical memory device including a substrate with a cell array region and a word line contact region defined thereon, gate electrodes configured to extend substantially parallel to a top surface of the substrate in the cell array region and the word line contact region and to be stacked while being spaced apart from one another in a first direction, wherein the first direction is a direction that is substantially perpendicular to the top surface of the substrate, a channel structure configured to pass through the gate electrodes in the first direction in the cell array region and to be electrically connected to the substrate, a dummy channel structure configured to pass through the gate electrodes in the word line contact region in the first direction and to be spaced apart from the substrate in the first direction, and an insulating structure between the dummy channel structure and the substrate, and a conductive line configured to be substantially parallel to the top surface of the substrate in the word line contact region and to be electrically connected to a first gate electrode, which is any one of the gate electrodes, wherein the conductive line is electrically connected to the dummy channel structure.

According to other embodiments, there is provided a vertical memory device including gate electrodes extending substantially parallel to a top surface of a substrate, the gate electrodes being stacked on the substrate while being spaced apart from one another in a direction normal to the top surface of the substrate, a channel structure through the gate electrodes and normal to the top surface of the substrate, the channel structure being electrically connected to the substrate, a dummy channel structure through the gate electrodes and normal to the top surface of the substrate, an insulating structure between the dummy channel structure and the substrate, and a conductive line extending parallel to the top surface of the substrate and overlapping at least a portion of a top of the dummy channel structure, the channel structure electrically connecting the conductive line to the substrate.

BRIEF DESCRIPTION OF THE DRAWINGS

Features will become apparent to those of ordinary skill in the art by describing in detail exemplary embodiments with reference to the attached drawings, in which:

FIG. 4A illustrates a plan view of a vertical memory device according to an example embodiment;

DETAILED DESCRIPTION

Figure 1:
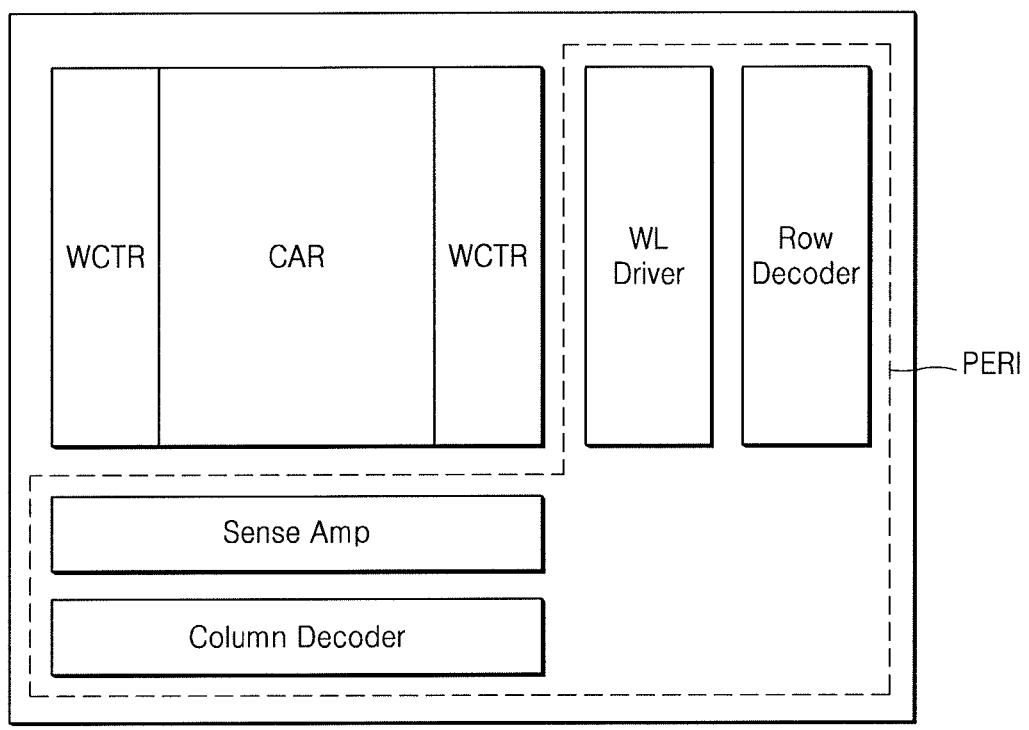
FIG. 1 illustrates a schematic block diagram of a vertical memory device according to an example embodiment.

Hereinafter, example embodiments will be described in detail with reference to the attached drawings. In the drawings, like elements are denoted by like reference numerals, and the repeated explanations thereabout will be skipped.

FIG. 1 shows a schematic block diagram of a vertical memory device according to an example embodiment.

Referring to FIG. 1, a vertical memory device according to the present embodiment may include a cell array region CAR, a word line contact region WCTR, and a peripheral circuit region PERI. In the cell array region CAR, memory cells, which are three-dimensionally arranged, and bit lines and word lines, which are electrically connected to the memory cells, may be formed. The word line contact region WCTR may be disposed between the cell array region CAR and the peripheral circuit region PERI, and, in the word line contact region WCTR, wiring plugs and conductive lines, which connect memory cells with peripheral circuits, may be formed. In the peripheral circuit region PERI, peripheral circuits, which drive memory cells and read data stored in memory cells, may be formed. In one embodiment, the peripheral circuit region PERI may include a word line driver, a sense amplifier, a row decoder, a column decoder, and a control circuit.

Figure 2:
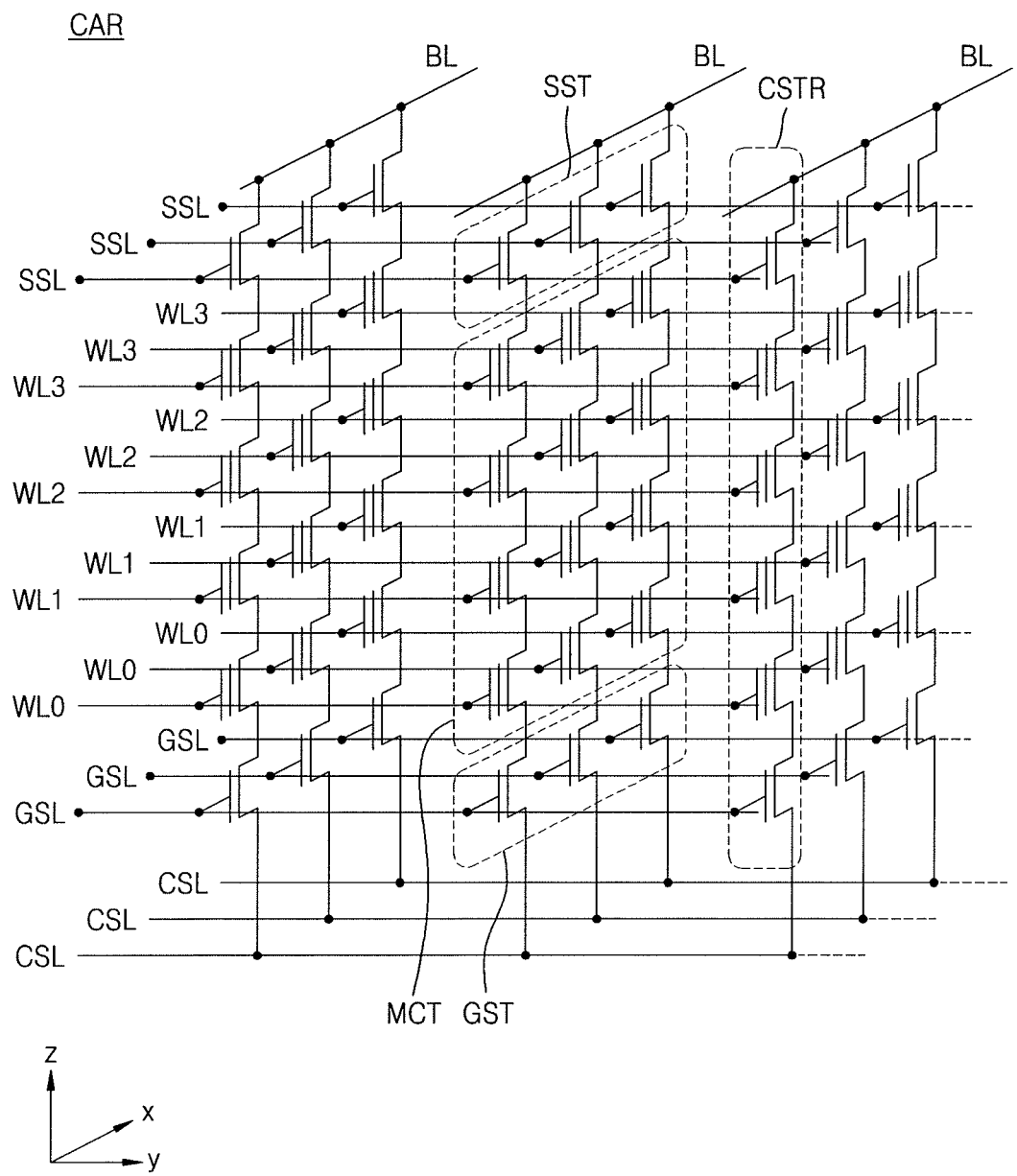
FIG. 2 illustrates a brief circuit diagram of a cell array of a vertical memory device according to an example embodiment.

FIG. 2 shows a portion of a circuit diagram of the cell array region CAR according to an example embodiment.

Referring to FIG. 2, the cell array region CAR of the vertical memory device according to the present embodiment may include a common source line CSL, bit lines BL, and a plurality of cell strings CSTR between the common source line CSL and the bit lines BL.

The bit lines BL are two-dimensionally arranged, and a plurality of cell strings CSTR are connected to each bit line BL in parallel. The cell strings CSTR may be commonly connected to a common source line CSL. That is, a plurality of cell strings CSTR may be disposed between a plurality of bit lines BL and a common source line CSL. In one example embodiment, a plurality of common source lines CSL may be two-dimensionally arranged. In this regard, the same voltage amplitude may be applied to the common source lines CSL, or different voltage amplitudes may be applied to the common source lines CSL.

Each of the cell strings CSTR may include a ground selection transistor GST connected to a common source line CSL, a string selection transistor SST connected to a bit line BL, and a plurality of memory cell transistors MCT between the ground selection transistor GST and the string selection transistor SST. The string selection transistor SST, the memory cell transistors MCT, and the ground selection transistor GST may be connected in series.

Referring to FIG. 2, one ground selection transistor GST and one string selection transistor SST are connected to n memory cell transistors MCT connected in series. However, in one embodiment, a plurality of ground cell transistors GST or a plurality of string selection transistors SST may be connected to n memory cell transistors MCT connected in series.

The common source line CSL may be commonly connected to sources of ground cell transistors GST. A ground selection line GSL, a plurality of word lines WL0 through WL3, and a string selection line SSL, which are between the common source line CSL and the bit lines BL, may be respectively used as a gate electrode of the ground selection transistor GST, gate electrodes of memory cell transistors MCT, and a gate electrode of the string selection transistor SST. Each of the memory cell transistors MCT may include a data storage element.

A drain terminal of the string selection transistor SST may be connected to the bit line BL. When a signal is applied to a gate electrode of the string selection transistor SST through the string selection line SSL, the signal applied through a bit line BL is transmitted in series to the memory cell transistors MCT, thereby enabling reading or writing data. When a signal is applied to a gate terminal of the ground selection transistor GST through a ground selection line GSL, an erase operation may be performed in which charges stored in the memory cell transistors MCT may be completely removed.

Figure 3A:
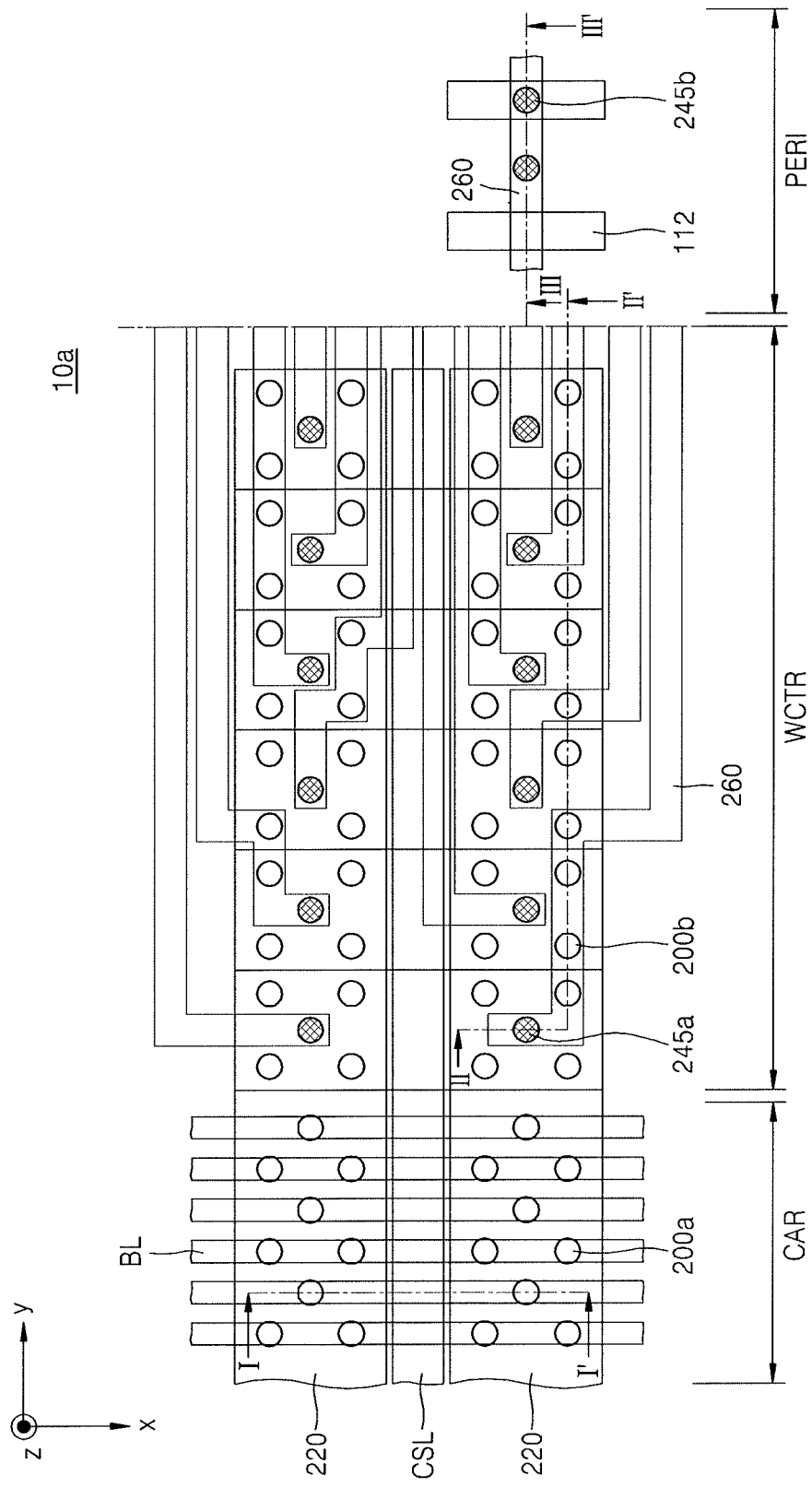
FIG. 3A illustrates a plan view of a vertical memory device according to an example embodiment.
Figure 3B:
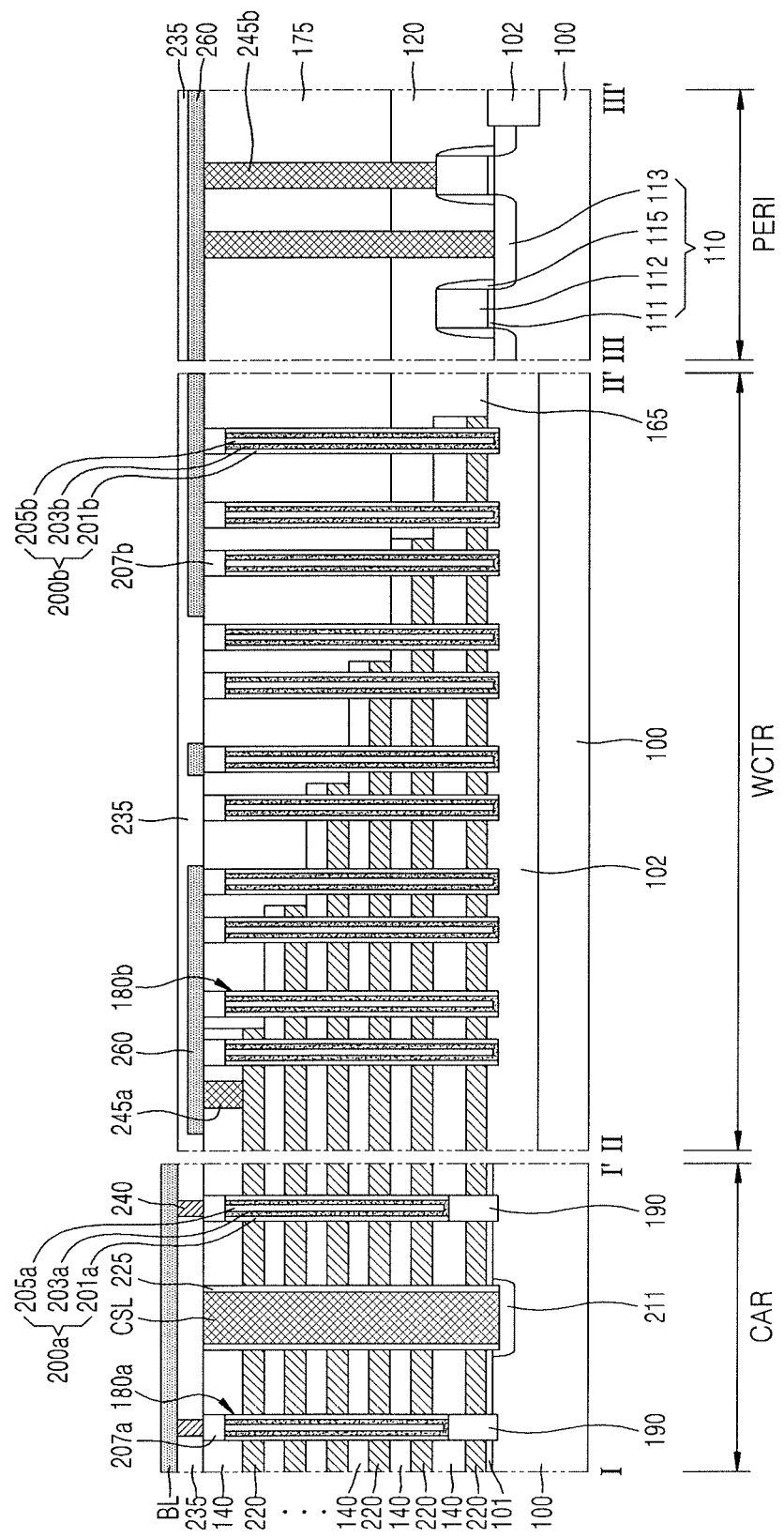
FIG. 3B illustrates a cross-sectional view along lines I-I', II-II', and III-III' in FIG. 3A.

FIG. 3A shows a plan view of a vertical memory device 10a according to an example embodiment. FIG. 3B shows a cross-sectional view taken along lines I-I', II-II', and III-III' in FIG. 3A.

Referring to FIGS. 3A and 3B, a first direction (z direction) is substantially perpendicular, e.g., normal, to a top surface of a substrate 100, and a second direction (x direction) and a third direction (y direction) are parallel to the top surface of the substrate 100, wherein the second direction crosses the third direction. In one embodiment, the second direction may be substantially perpendicular to the third direction, and the second direction may cross the third direction. The second direction and the third direction may substantially be perpendicular to the first direction. In the drawings herein, an arrow direction and a direction opposite thereto are considered as being the same direction. The descriptions about directions are commonly applied to drawings used in the present specification.

Referring to FIGS. 3A and 3B, the vertical memory device 10a according to an example embodiment may include the cell array region CAR, the word line contact region WCTR, and the peripheral circuit region PERI described previously with reference to FIGS. 1-2, all constituting the substrate 100. In the cell array region CAR, gate electrodes 220, channel structures 200a, common source lines CSL, and bit lines BL may be disposed. In the word line contact region WCTR, dummy channel structures 200b, first wiring plugs 245a, and conductive lines 260 may be disposed. In the peripheral circuit region PERI, peripheral transistors 110, second wiring plugs 245b, and the conductive lines 260 may be disposed.

The substrate 100 may include a device isolation film 102 defining an active region. The substrate 100 may include a material having semiconductor characteristics, e.g., a silicon wafer. The gate electrodes 220 and interlayer insulating films 140 may surround side walls of the channel structures 200a, and may extend from the cell array region CAR to the word line contact region WCTR. In the word line contact region WCTR, the gate electrodes 220 may be arranged to form a continuous stair structure. Accordingly, horizontal lengths of the gate electrodes 220 may vary. The gate electrodes 220 may have shorter horizontal lengths away, i.e., as a distance increases, from the substrate 100. In one embodiment, from among the gate electrodes 220, the lowermost gate electrode 220 may have the longest horizontal length, and the uppermost gate electrode 220 may have the shortest horizontal length. The gate electrodes 220 may be insulated from one another by the interlayer insulating films 140.

The gate electrodes 220 may include at least one ground selection gate electrode, a plurality of memory cell gate electrodes, and a string selection gate electrode. A ground selection gate electrode may be the lowermost gate electrode 220, and the string selection gate electrode may be the uppermost gate electrode. The memory cell gate electrodes may be stacked between the ground selection gate electrode and the string selection gate electrode. Referring to FIG. 3B, there are four (4) memory cell gate electrodes illustrated therein. However, embodiments are not limited thereto, e.g., eight (8), sixteen (16), thirty-two (32), or sixty-four (64) memory cell gate electrodes may be formed between the ground selection gate electrode and the string selection gate electrode.

Thickness of the memory cell gate electrodes may be substantially identical. Thicknesses of the ground selection gate electrode and the string selection gate electrode may be different from those of the memory cell gate electrodes. In one embodiment, the thicknesses of the ground selection gate electrode and the string selection gate electrode may be greater than those of the memory cell gate electrodes. In example embodiments, the memory cell gate electrodes may be word lines. The ground selection gate electrode may be a ground selection line, and the string selection gate electrode may be a string selection line. The gate electrodes 220 may include, e.g., tungsten, copper, or metal silicide.

Thicknesses of the interlayer insulating films 140 may not be identical to one another, e.g., the lowermost interlayer insulating film 140 may be thicker than other interlayer insulating films 140. The interlayer insulating films 140 may include an insulating material, e.g., silicon oxide, silicon nitride, silicon oxynitride, or the like.

In the cell array region CAR, the gate electrodes 220 and the interlayer insulating films 140 may be alternately stacked. The channel structures 200*a* may pass through the stacked gate electrodes 220 and the interlayer insulating films 140 in the first direction (z direction) and contact semiconductor patterns 190. The memory cell transistors MCT and the string selection transistor SST may be disposed where the channel structures 200*a* cross the gate electrodes 220. The ground selection transistor GST may be disposed where the semiconductor patterns 190 cross the gate electrodes 220.

Each of the channel structures 200*a* may include a first dielectric film pattern 201*a*, a first vertical channel pattern 203*a*, and a first filling insulating film pattern 205*a*. The first vertical channel pattern 203*a* may be electrically connected to the substrate 100 via the semiconductor pattern 190. In one or more embodiments, the semiconductor patterns 190 may be disposed between the channel structures 200*a* and the substrate 100, and may be configured to electrically connect the channel structures 200*a* with the substrate 100. Each of the channel structures 200*a* may have a bottom surface that lies at a higher level than a top surface of the lowermost gate electrode 220. Contact pads 207*a* may be formed on top surfaces of the channel structures 200*a*. The contact pads 207*a* may each include, e.g., impurity-doped poly silicon.

Referring to FIG. 3A, in a top view of the channel structures 200*a*, the channel structures 200*a* may form rows and columns, thereby forming a two-dimensional arrangement. The channel structures 200*a* may be arranged in a zig-zag shape. In one or more embodiments, the rows or columns of the channel structures 200*a* may be alternately arranged and be spaced apart from one another. The common source line CSL may pass through the gate electrodes 220 and the interlayer insulating films 140 in the first direction (z direction). The common source line CSL may include, for example, a conductive material, e.g., tungsten (W). An impurity region 211 may be where the substrate 100 contacts the common source line CSL, and an insulating spacer 225 may be disposed on side walls of the common source line CSL. The impurity region 211 may include an impurity, e.g., P or As, implanted into the substrate 100.

The common source line CSL may extend vertically through the gate electrodes 220 and the interlayer insulating films 140, and contact the impurity region 211. The common source line CSL may have a dam-like shape. In one embodiment, in a top view of the common source line CSL, the common source line CSL may have a line or bar-shape. The insulating spacer 225 may be formed between the common source line CSL and the gate electrodes 220. The insulating spacer 225 may be disposed on side walls of the common source line CSL. The insulating spacer 225 may insulate the common source line CSL from the gate electrodes 220. The insulating spacer 225 may include, e.g., silicon oxide, silicon nitride, silicon oxynitride, or other insulating materials.

The first wiring plugs 245*a* may extend in the first direction (z direction) through a top insulating film 175 or through both the top insulating film 175 and a bottom insulating pattern 165, and may electrically connect any one of the gate electrodes 220 with the conductive line 260. The second wiring plugs 245*b* may extend in the first direction (z direction) through the top insulating film 175 and a peripheral insulating film 120, and may electrically connect the conductive lines 260 with the peripheral transistors 110 formed in the peripheral circuit region PERI.

The first wiring plugs 245*a* may be connected to the string selection gate electrode, the memory cell gate electrodes, and the ground selection gate electrode. Referring to FIG. 3A, the first wiring plugs 245*a* may be arranged in a row on the gate electrodes 220 in the word line contact region WCTR. The second wiring plugs 245*b* may be connected to a peripheral gate electrode 112 and a source/drain region 113 of each of the peripheral transistors 110 in the peripheral circuit region PERI.

In this regard, the first wiring plugs 245*a* and the second wiring plugs 245*b* may include, for example, a conductive material, e.g., tungsten. Top surfaces of the first wiring plugs 245*a*, the second wiring plugs 245*b*, and the common source line CSL may lie at the same level. This is because, as to be described later, the first wiring plugs 245*a*, the second wiring plugs 245*b*, and the common source line CSL may be formed by an etch-back process or a chemical mechanical polishing (CMP) process.

The dummy channel structures 200*b* may have a shape and structure that are similar to those of the channel structures 200*a*. In one embodiment, each of the dummy channel structures 200*b* may include a second dielectric pattern 201*b*, a second vertical channel pattern 203*b*, and a second filling insulating film pattern 205*b*. Top surfaces of the dummy channel structures 200*b* may lie at the same level as top surfaces of the channel structures 200*a*. The dummy channel structures 200*b* may contact the device isolation film 102 of the word line contact region WCTR through the gate electrodes 220 and the interlayer insulating films 140. Bottom surfaces of the channel structures 200*a* may be farther away from the top surface of the substrate 100 than bottom surfaces of the dummy channel structures 200*b*. In one embodiment, a length of each of the channel structures 200*a* in the first direction may be less than that of each of the dummy channel structures 200*b* in the first direction. The bottom surfaces of the dummy channel structures 200*b* may lie at a lower level than the bottom surfaces of the channel structures 200*a*.

Referring to FIG. 3A, in a top view of the dummy channel structures 200*b*, the dummy channel structures 200*b* passing through the gate electrodes 220 are arranged in rows and columns in such a manner that four dummy channel structures 200*b* surround each of the first wiring plugs 245*a* connected to the gate electrodes 220. However, embodiments are not limited thereto.

Dummy contact pads 207*b* may be formed on the top surfaces of the dummy channel structures 200*b*. The composition of the dummy contact pads 207*b* may be substantially the same as the composition of the contact pads 207*a*. The top surfaces of the dummy contact pads 207*b* may lie at the same level as the top surfaces of the contact pads 207*a*. In this regard, the top surfaces of the dummy contact pads 207*b* may lie at the same level as top surfaces of the first wiring plugs 245*a*, the second wiring plugs 245*b*, and the common source line CSL.

The semiconductor patterns 190 may protrude from the substrate 100 and may be disposed between the channel structures 200*a* and the substrate 100, in the cell array region CAR. Top surfaces of the semiconductor patterns 190 may lie at a higher level than the top surface of the lowermost gate electrode 220. The semiconductor patterns 190 may contact the first vertical channel pattern 203a of each of the channel structures 200a. The first vertical channel pattern 203a may be electrically connected to the substrate 100 through the semiconductor pattern 190. The semiconductor patterns 190 may be formed by a selective epitaxial growth (SEG) process that uses the top surface of the substrate 100 as a seed. Accordingly, the semiconductor patterns 190 may be formed only within channel holes 180a exposing the top surface of the substrate 100, not within dummy holes 180b formed on the device isolation film 102.

A bottom gate insulating film 101 may be disposed between the lowermost gate electrode 220 and the substrate 100, in the cell array region CAR. The bottom gate insulating film 101 may include an insulating material, e.g., silicon oxide, silicon nitride, silicon oxynitride, or the like. A thickness of the bottom gate insulating film 101 in the first direction (z direction) may be less than that of each of the interlayer insulating films 140 in the first direction.

The bottom insulating pattern 165 may be disposed in the word line contact region WCTR. In some cases, a portion of the bottom insulating pattern 165 may extend to the peripheral circuit region PERI. In the word line contact region WCTR, the bottom insulating pattern 165 may be disposed on top or side surfaces of the interlayer insulating films 140 and the gate electrodes 220 and a side surface of the peripheral insulating film 120, and on the device isolation film 102. A top surface of the bottom insulating pattern 165 and a top surface of the peripheral insulating film 120 may form a single plane. The bottom insulating pattern 165 may include an insulating material, such as silicon oxide.

The peripheral transistors 110 may form a peripheral circuit on the substrate 100 in the peripheral circuit region PERI. Each of the peripheral transistors 110 may include a peripheral gate insulating pattern 111, a peripheral gate electrode 112, a source/drain region 113, and gate spacers 115. The peripheral transistors 110 may be covered by the peripheral insulating film 120. The top insulating film 175 may be formed on top and side surfaces of the interlayer insulating films 140 and the gate electrodes 220 in the word line contact region WCTR, and on the bottom insulating pattern 165 and the peripheral insulating film 120. In one embodiment, the top insulating film 175 may surround side surfaces of the dummy channel structures 200b and the first and second wiring plugs 245a and 245b. In one embodiment, the first and second wiring plugs 245a and 245b and the dummy channel structures 200b may vertically pass through the top insulating film 175. The top insulating film 175 and the uppermost interlayer insulating film 140 may form a single plane. That is, the top surface of the top insulating film 175 may lie at the same level as the top surface of the interlayer insulating film 140, thereby forming a continuous plane.

The conductive lines 260 may be disposed in the word line contact region WCTR and the peripheral circuit region PERI. The conductive lines 260 may extend on the first wiring plugs 245a, the second wiring plugs 245b, the uppermost interlayer insulating film 140, and the top insulating film 175, in a direction parallel to the top surface of the substrate 100. The conductive lines 260 may each have, e.g., a curved structure or a bent structure. In one embodiment, the conductive lines 260 may each have a portion extending in the second direction (x direction) or a portion extending in the third direction (y direction), as illustrated in FIG. 3A. That is, the conductive lines 260 may each have a two-directional structure.

The conductive lines 260 may be electrically connected to the gate electrodes 220 through the first wiring plugs 245a and to the peripheral transistors 110 through the second wiring plugs 245b. In this regard, the conductive lines 260 may cross at least a portion of each of the dummy channel structures 200b extending in the first direction (z direction). In one embodiment, the conductive lines 260 may cross at least a portion of each of the dummy contact pads 207b extending in the first direction (z direction). Top surfaces of the dummy contact pads 207b and bottom surfaces of the conductive lines 260 may lie at the substantially same level. In one or more embodiments, the conductive lines 260 may contact the dummy contact pads 207b. In one or more embodiments, the conductive lines 260 may be directly connected to the dummy contact pads 207b. As described above, the top surfaces of the first wiring plugs 245a, second wiring plugs 245b, common source line CSL, dummy contact pads 207b, uppermost interlayer insulating film, and top insulating film 175 may lie at the same level as bottom surfaces of the conductive lines 260.

As to be described in connection with FIG. 5Q, since the common source line CSL and the first and second wiring plugs 245a and 245b are formed at the same time, e.g., simultaneously, a top surface of the common source line CSL and the top surfaces of the first and second wiring plugs 245a and 245b lie at the same level. Compared to a related method, e.g., when a common source line is formed before formation of the first and second wiring plugs, the distance between the top surfaces of the dummy contact pads 207b and the bottom surfaces of the conductive lines 260 in the first direction (z direction) may be reduced. Accordingly, when the conductive lines 260 cross a portion of the dummy channel structures 200b, the conductive lines 260 may be potentially short-circuited with the substrate 100 through the dummy contact pads 207b and the dummy channel structures 200b.

Furthermore, when each of the conductive lines 260 has a curved structure or a bent structure, or when the conductive lines 260 have a two-directional structure extending in the second direction (x direction) and the third direction (y direction), a bent portion of each of the conductive lines 260 may undergo corner-rounding. Accordingly, for the conductive lines 260 not to cross a portion of each of the dummy channel structures 200b extending in the first direction (z direction), there is a limitation on designing of a conductive line having a two-directional structure.

Therefore, according to one or more embodiments, the dummy channel structures 200b are formed on the device isolation film 102, e.g., the device isolation film 102 completely separates bottoms of the dummy channel structures 200b from the substrate 100. Accordingly, the semiconductor patterns 190, which are formed by SEG, may be formed only in the channel holes 180a of the cell array region CAR, not in the dummy holes 180b of the word line contact region WCTR. Further, the dummy channel structures 200b are spaced apart from the substrate 100 with the device isolation film 102 therebetween. Thus, even when the conductive lines 260 cross a portion of each of the dummy channel structures 200b that extends in the first direction (z direction), the conductive lines 260 may not be short-circuited with respect to the substrate 100. In other words, even when the conductive lines 260 are configured to be electrically connected to the dummy channel structures 200b through the dummy contact pads 207b, the conductive lines 260 may not be short-circuited with respect to the substrate 100, e.g., due to the separation therefrom via the device isolation film 102. Accordingly, the conductive lines 260 may cross a portion of each of the dummy contact pads 207b extending in the first direction (z direction). Therefore, the conductive lines 260, i.e., the conductive lines 260 in the word line contact region WCTR, may have a higher degree of freedom The interlayer insulating film 235 may be formed on the uppermost interlayer insulating film 140 and the top insulating film 175, the interlayer insulating film 235 covering the channel structures 200a, the common source line CSL, and the dummy channel structures 200b. The top interlayer insulating film 235 may surround side surfaces of bit line plugs 240. In one embodiment, the bit line plugs 240 may vertically pass through the top interlayer insulating film 235. The top interlayer insulating film 235 may surround side surfaces and top surfaces of the conductive lines 260.

The top insulating film 175 and the top interlayer insulating film 235 may include, e.g., a high-density plasma (HDP) oxide film, tetraethylorthosilicate (TEOS), plasma enhanced TEOS (PE-TEOS), O3-tetra ethylOrtho silicate (O3-TEOS), undoped silicate glass (USG), phosphosilicate glass (PSG), borosilicate glass (BSG), borophosphosilicate glass (BPSG), fluoride silicate glass (FSG), spin on glass (SOG), tonensilazene (TOSZ), or a combination thereof.

The bit lines BL may be formed on the top interlayer insulating film 235. The bit line plugs 240 may be disposed between the bit lines BL and the channel structures 200a. The bit line plugs 240 may electrically connect the bit lines BL with the channel structures 200a. The bit lines BL and the bit line plugs 240 may each include a conductive material, e.g., doped silicon, metal silicide, or metal.

Figure 4B:
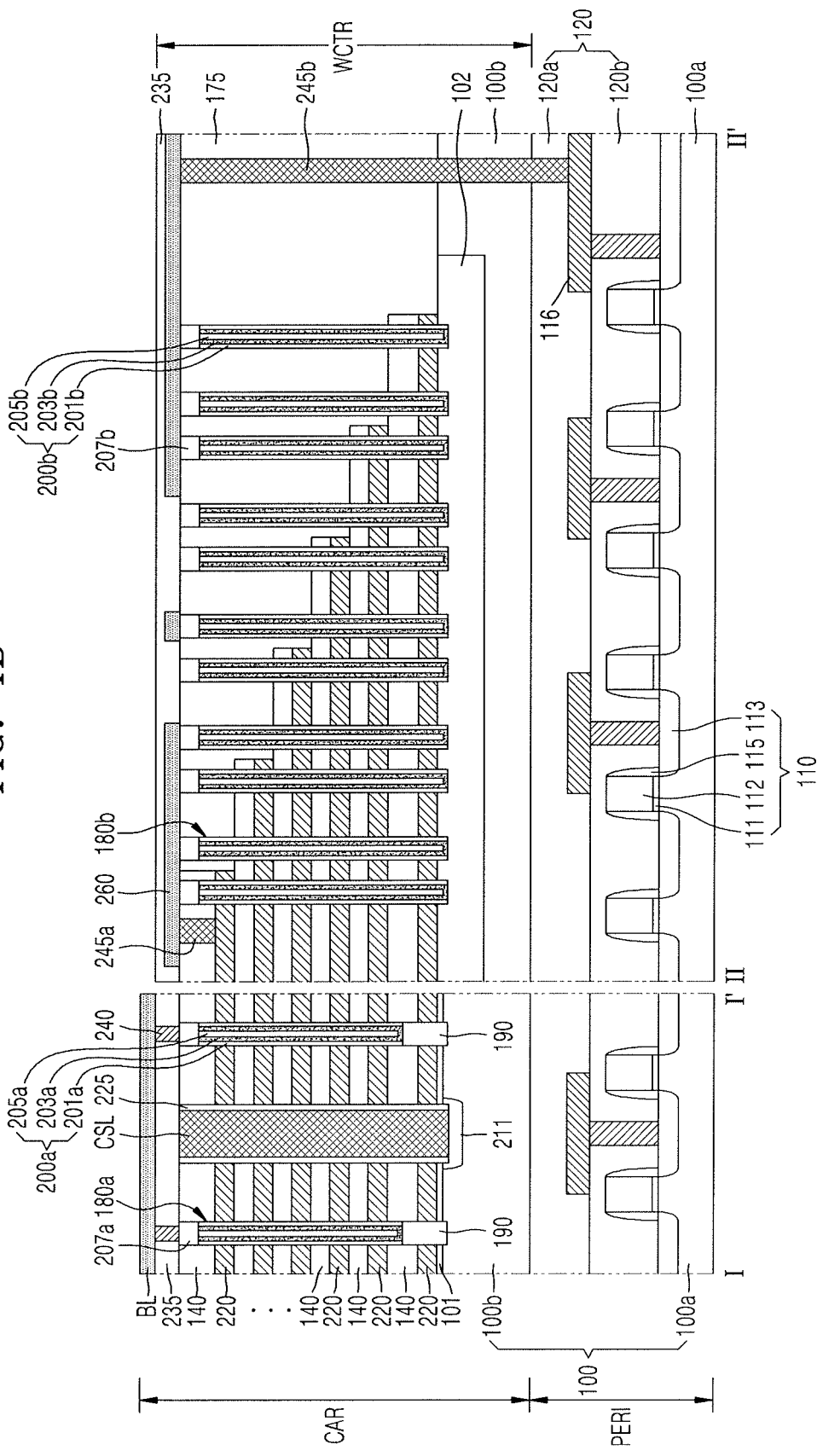
FIG. 4B illustrates a cross-sectional view along lines I-I' and II-II' in FIG. 4A.

FIG. 4A shows a plan view of a vertical memory device 10b according to an example embodiment. FIG. 4B shows a cross-sectional view taken along lines I-I' and II-II' illustrated in FIG. 4A.

Referring to FIGS. 4A and 4B, the vertical memory device 10b according to the present embodiment may include the cell array region CAR, the word line contact region WCTR, and the peripheral circuit region PERI on the substrate 100. The substrate 100 may include a first substrate 100a and a second substrate 100b. The first substrate 100a may be disposed under the second substrate 100b. The peripheral circuit region PERI may be disposed on the first substrate 100a, and the cell array region CAR and the word line contact region WCTR may be disposed on the second substrate 100b. The peripheral transistors 110 for forming a peripheral circuit may be disposed on the first substrate 100a. In this case, each of the peripheral transistors 110 may include the peripheral gate insulating pattern 111, the peripheral gate electrodes 112, the source/drain region 113, and the gate spacer 115. A first peripheral insulating film 120b may be disposed on the first substrate 100a having the peripheral transistors 110. Peripheral conductive lines 116 and a second peripheral insulating film 120a may be disposed on the first peripheral insulating film 120b to electrically connect the peripheral transistors 110 each other.

The peripheral transistors 110 for forming a peripheral circuit may be formed on the first substrate 100a, and the resultant structure is covered by the peripheral insulating film 120, and then, the second substrate 100b may be formed on the peripheral insulating film 120. The second substrate 100b may include the device isolation film 102 for defining an active region. Elements formed on the second substrate 100b in the cell array region CAR and the word line contact region WCTR are the same as elements that have been described in connection with FIG. 3A, and accordingly, descriptions thereof will be skipped herein.

Referring to FIG. 4B, only one of the peripheral conductive lines 116 is connected to any one of the second wiring plugs 245b. However, in one or more embodiments, the peripheral conductive lines 116 may be connected to the second wiring plugs 245b, respectively.

Figure 5A:
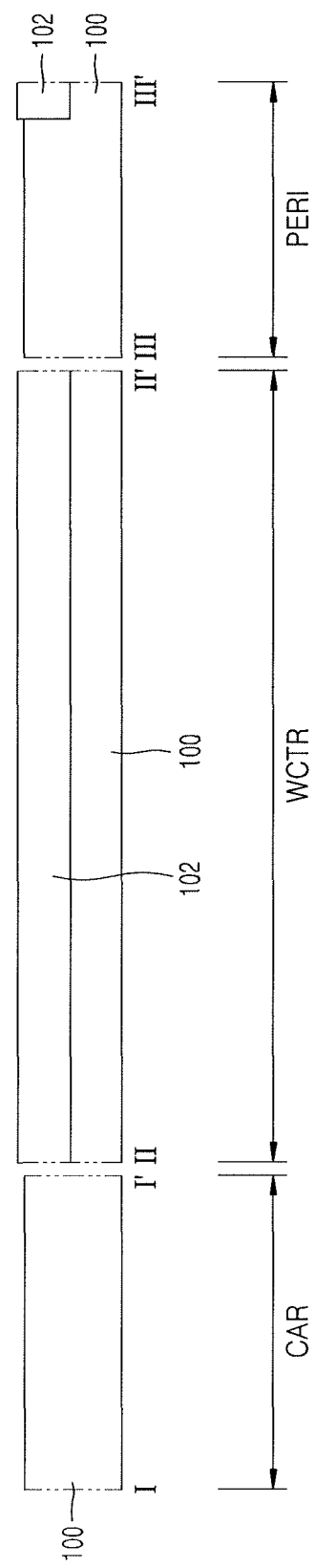
FIGS. 5A to 5S illustrate cross-sectional views along lines I-I', II-II', and III-III' in FIG. 3A to explain stages in a method of fabricating a vertical memory device according to an example embodiment.
Figure 5B:
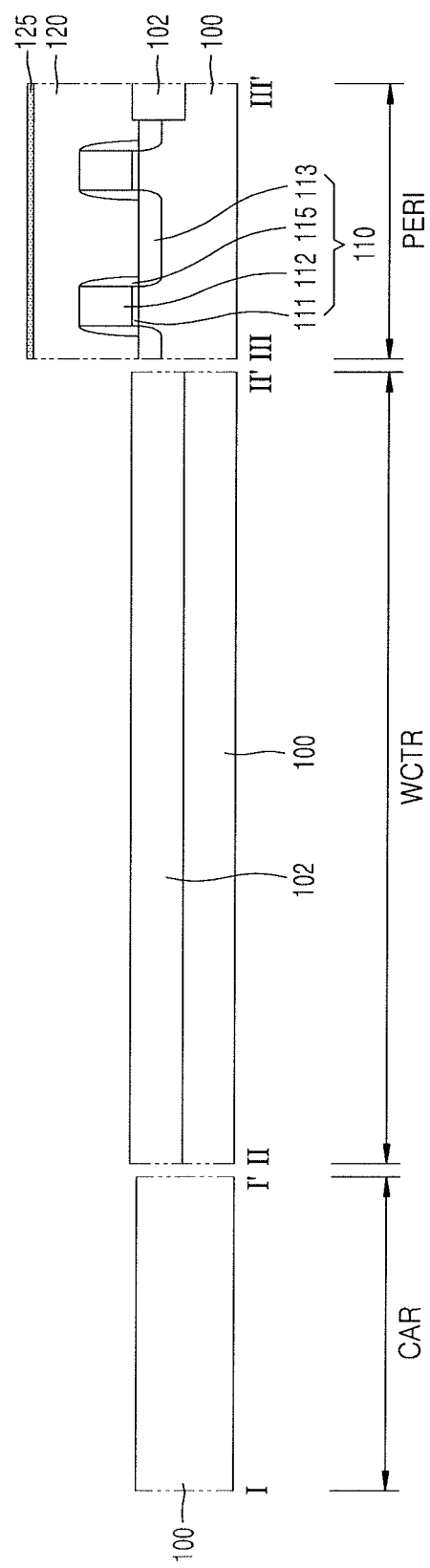
Figure 5C:
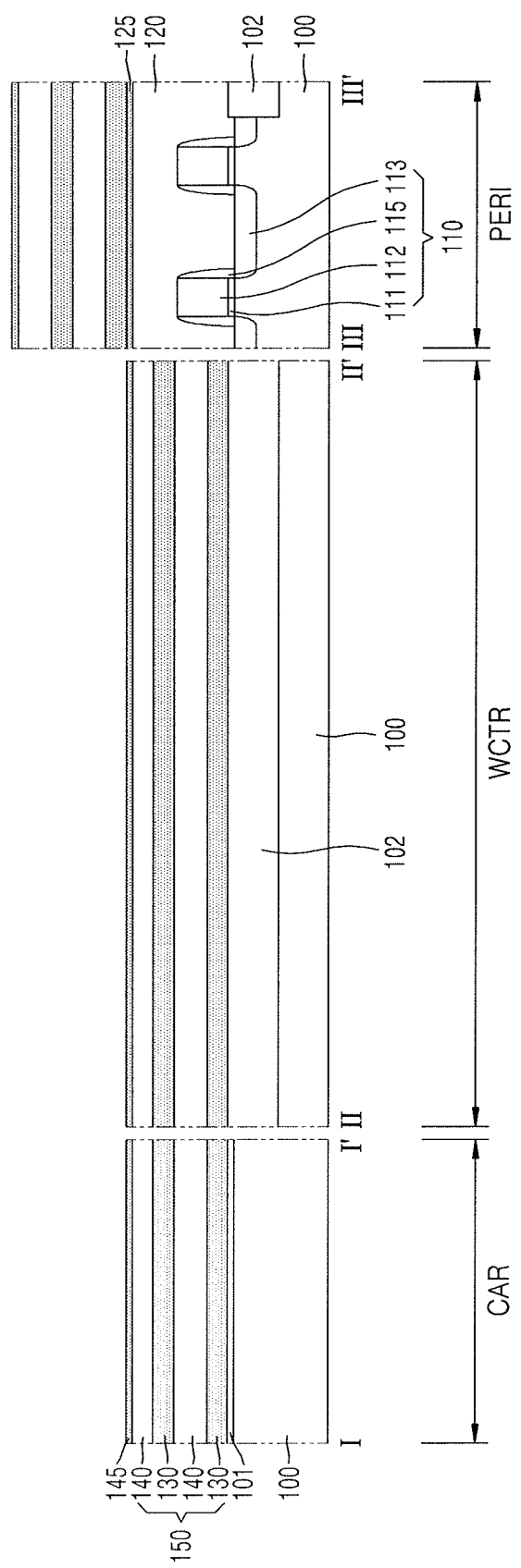
Figure 5D:
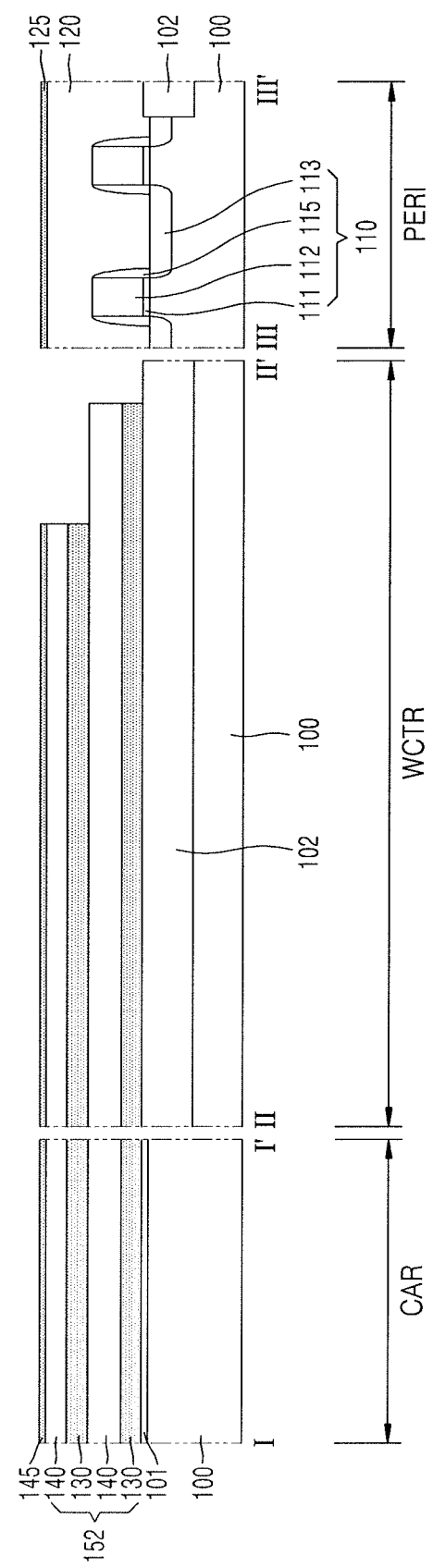
Figure 5E:
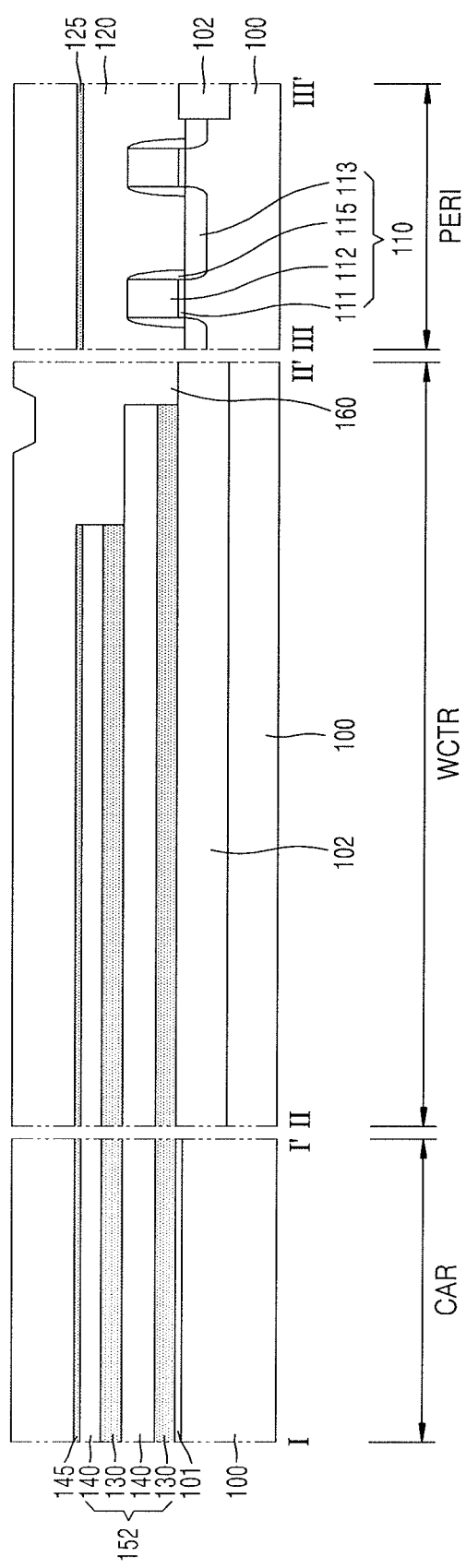
Figure 5F:
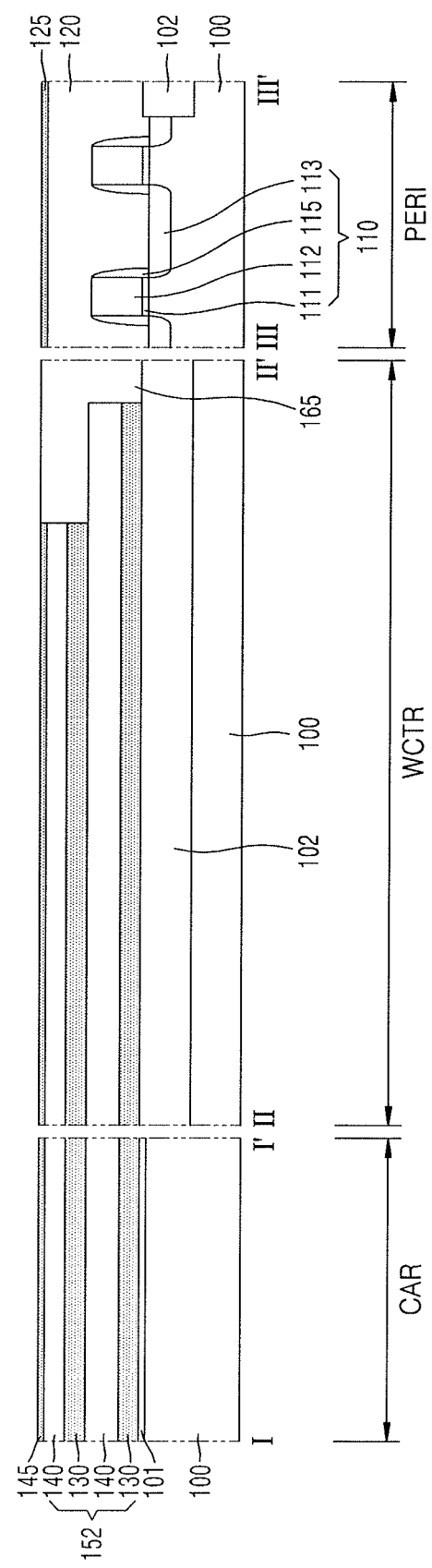
Figure 5G:
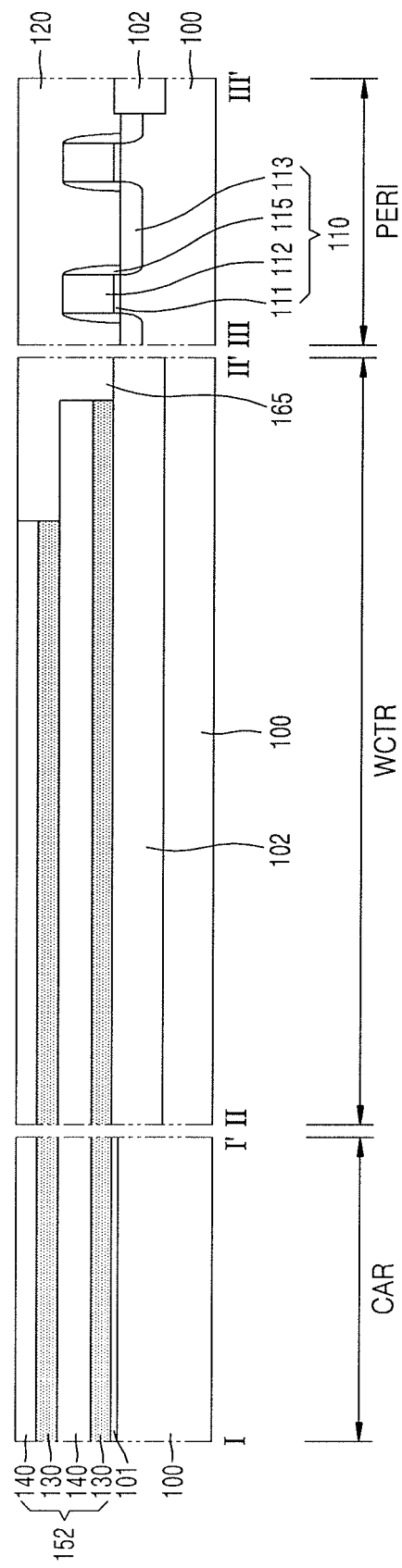
Figure 5H:
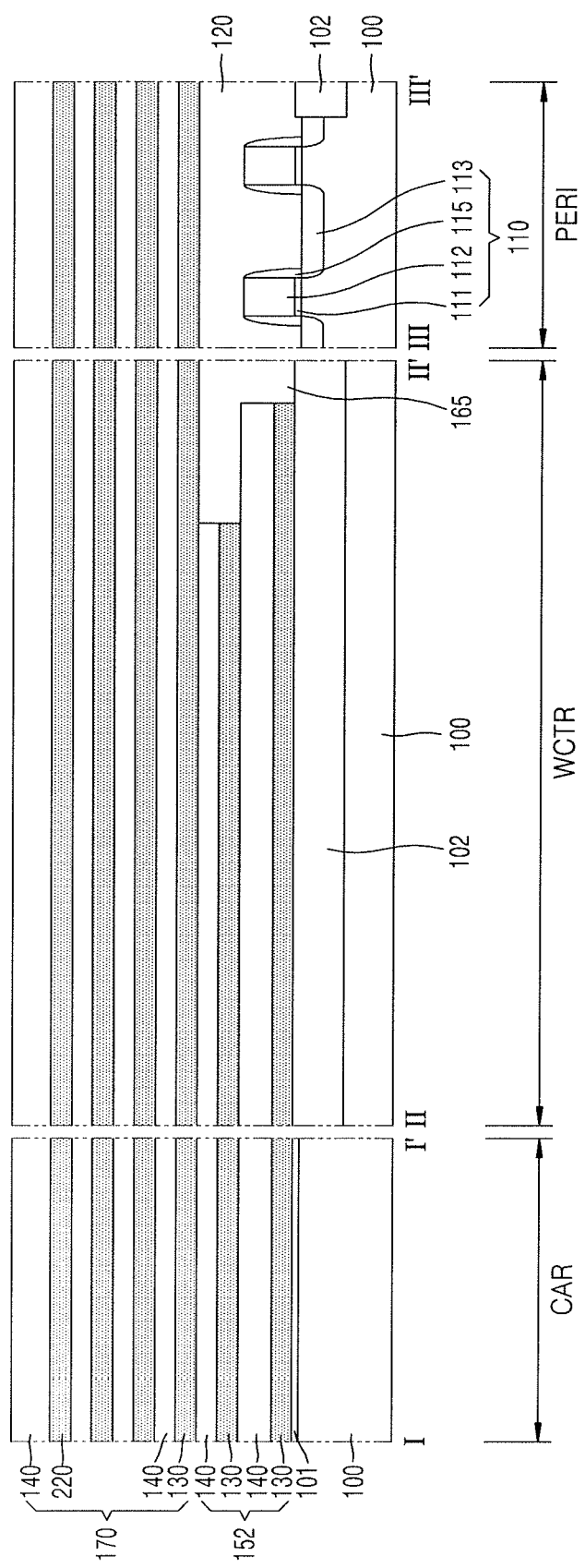
Figure 5I:
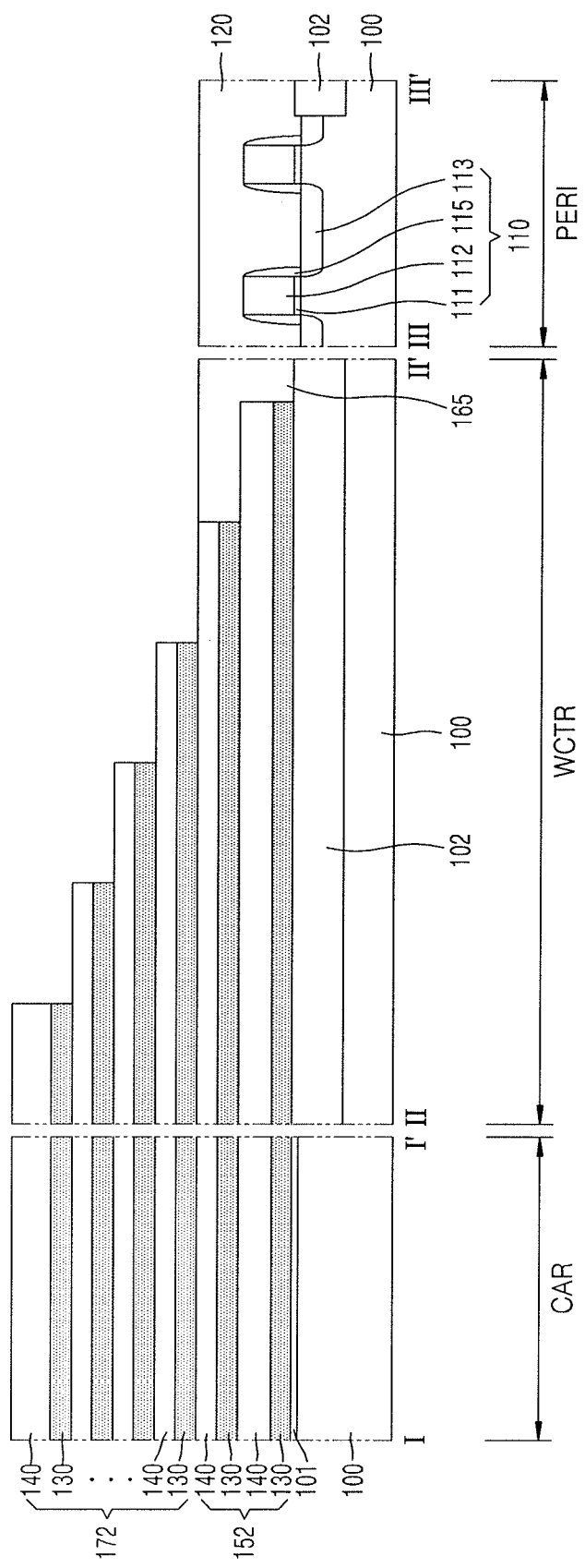
Figure 5J:
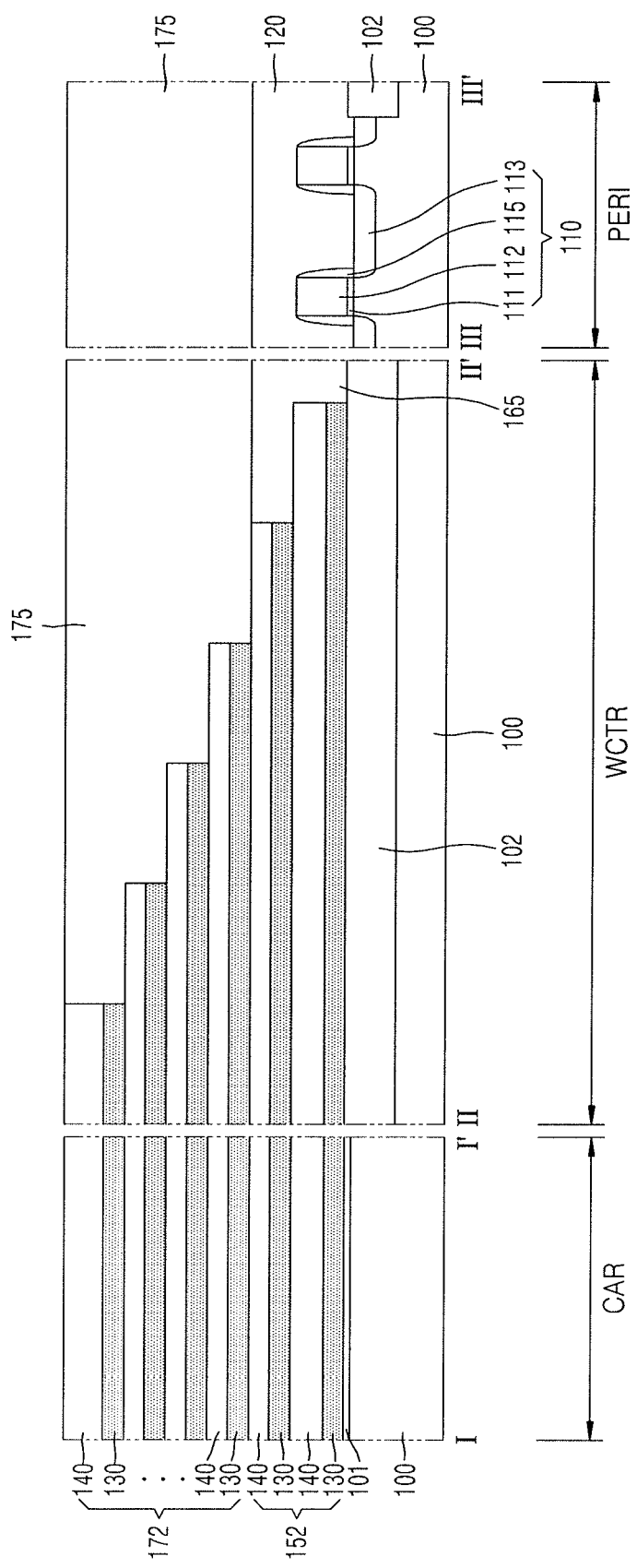
Figure 5K:
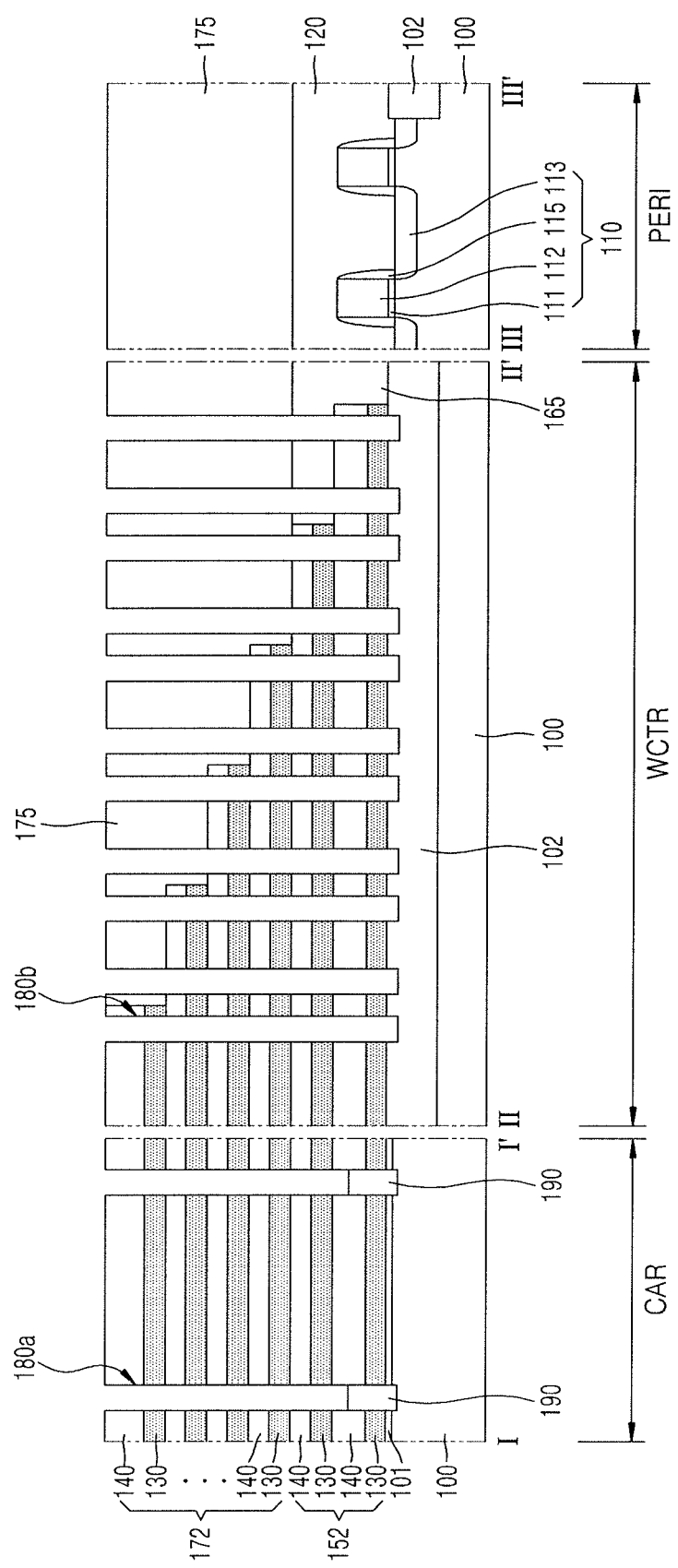
Figure 5L:
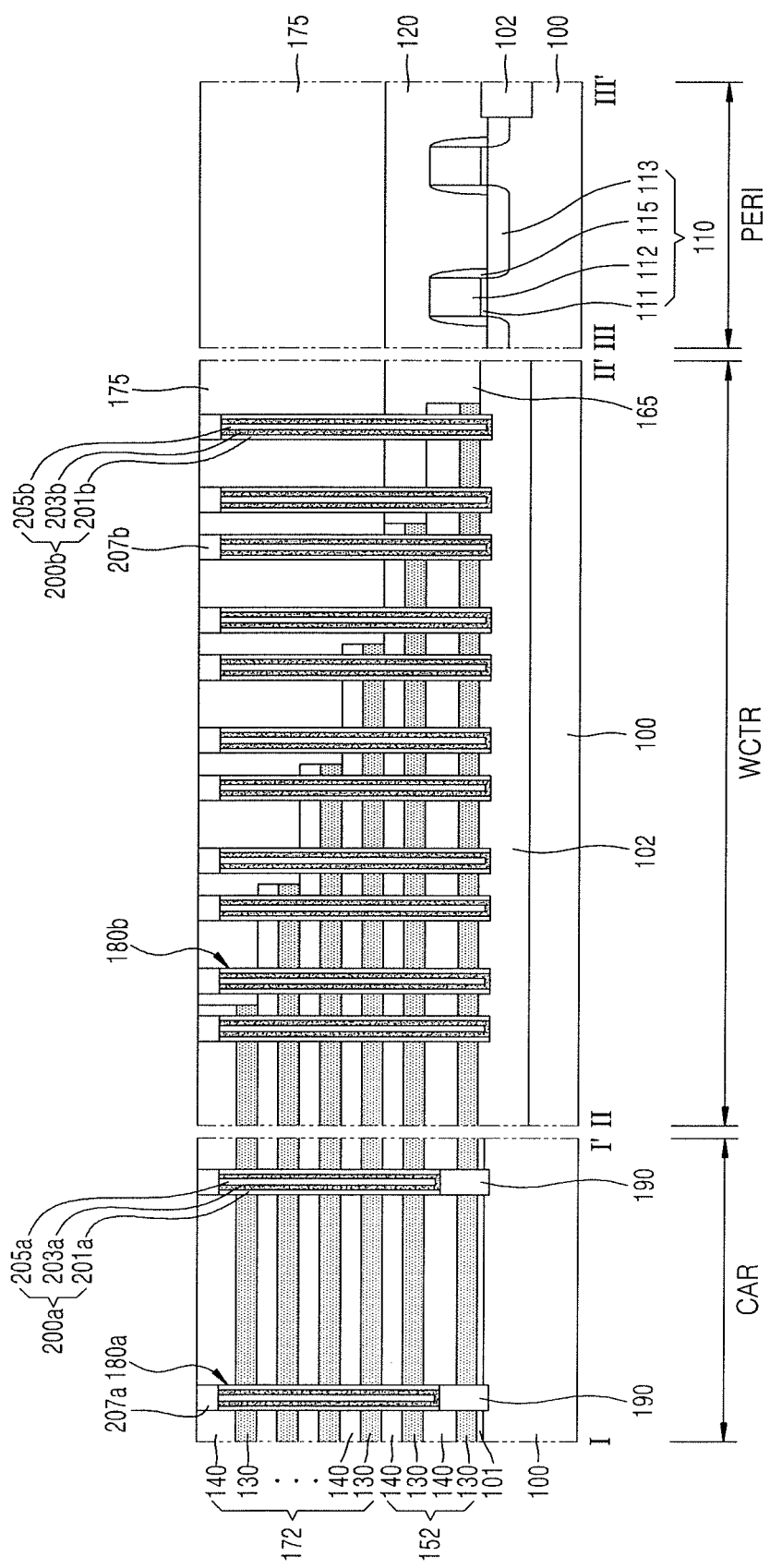
Figure 5M:
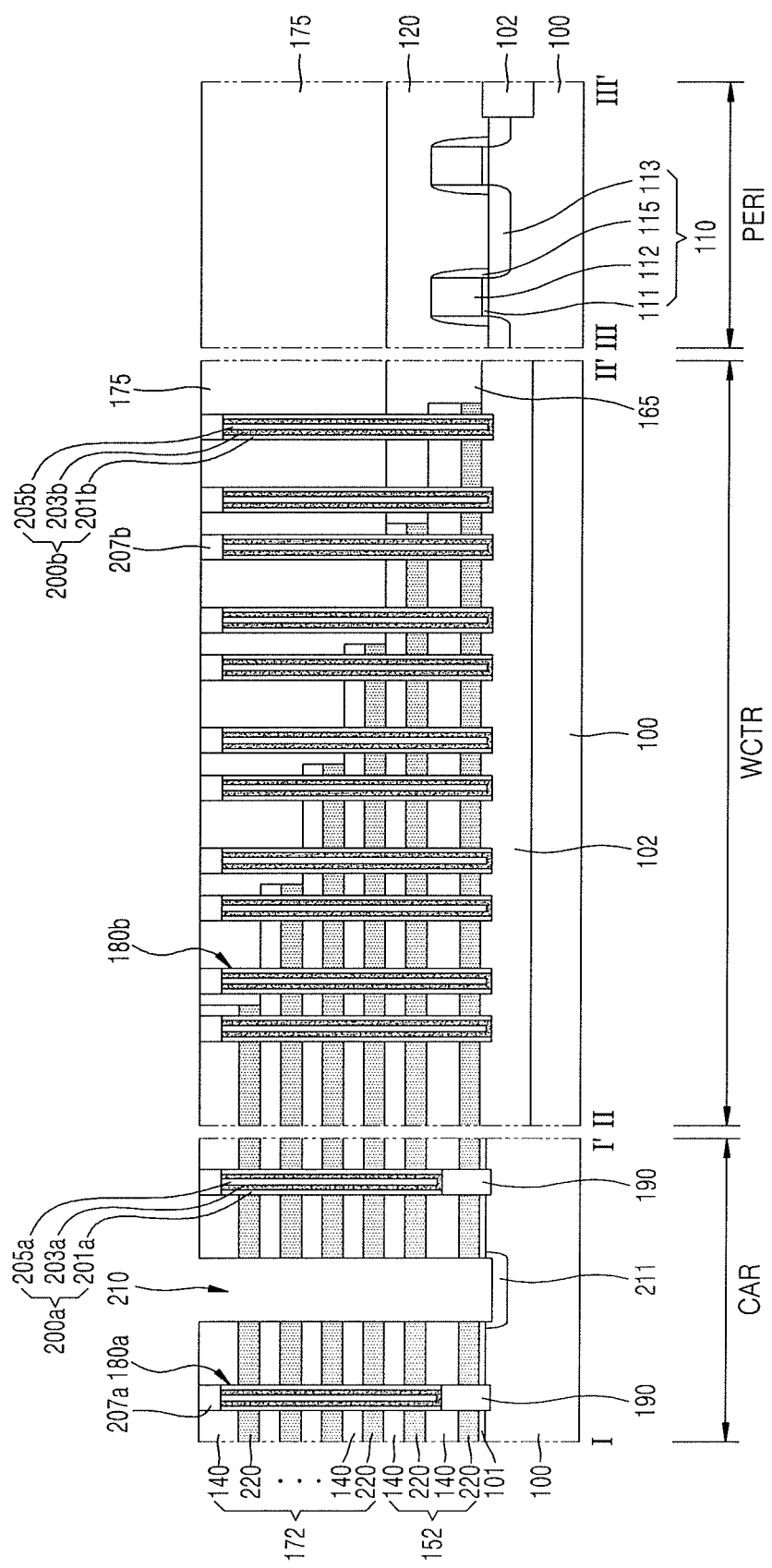
Figure 5N:
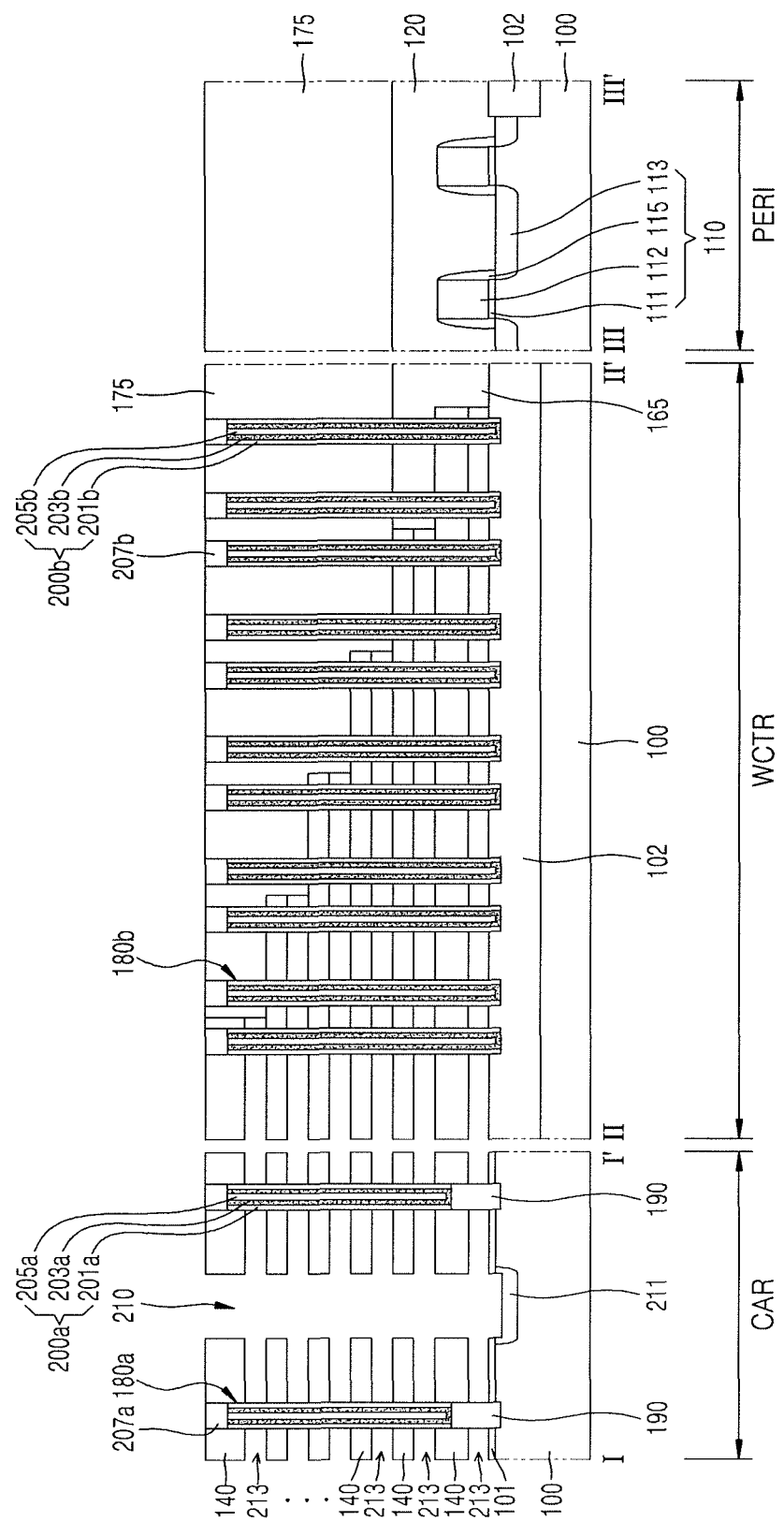
Figure 50:
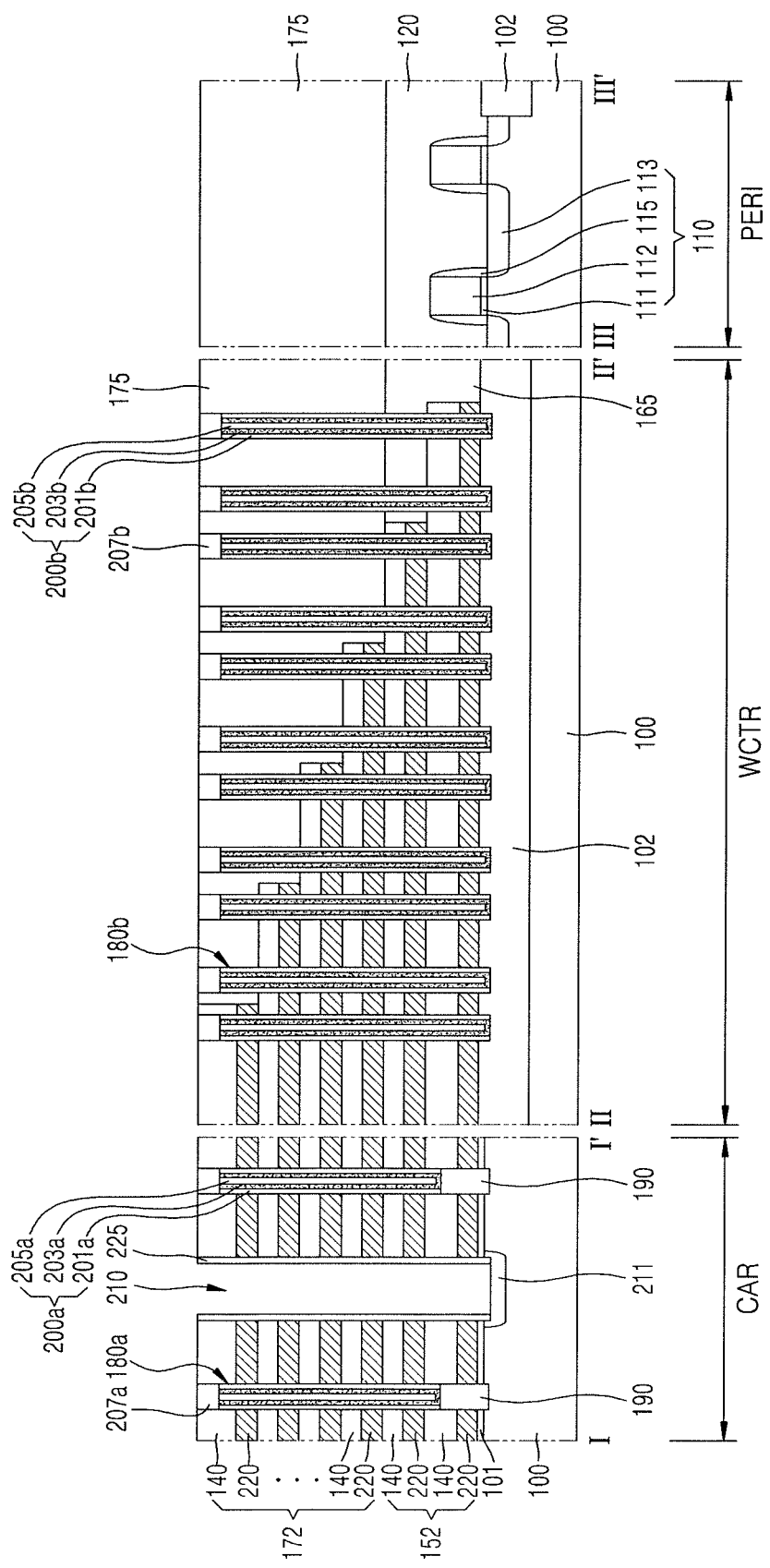
Figure 5P:
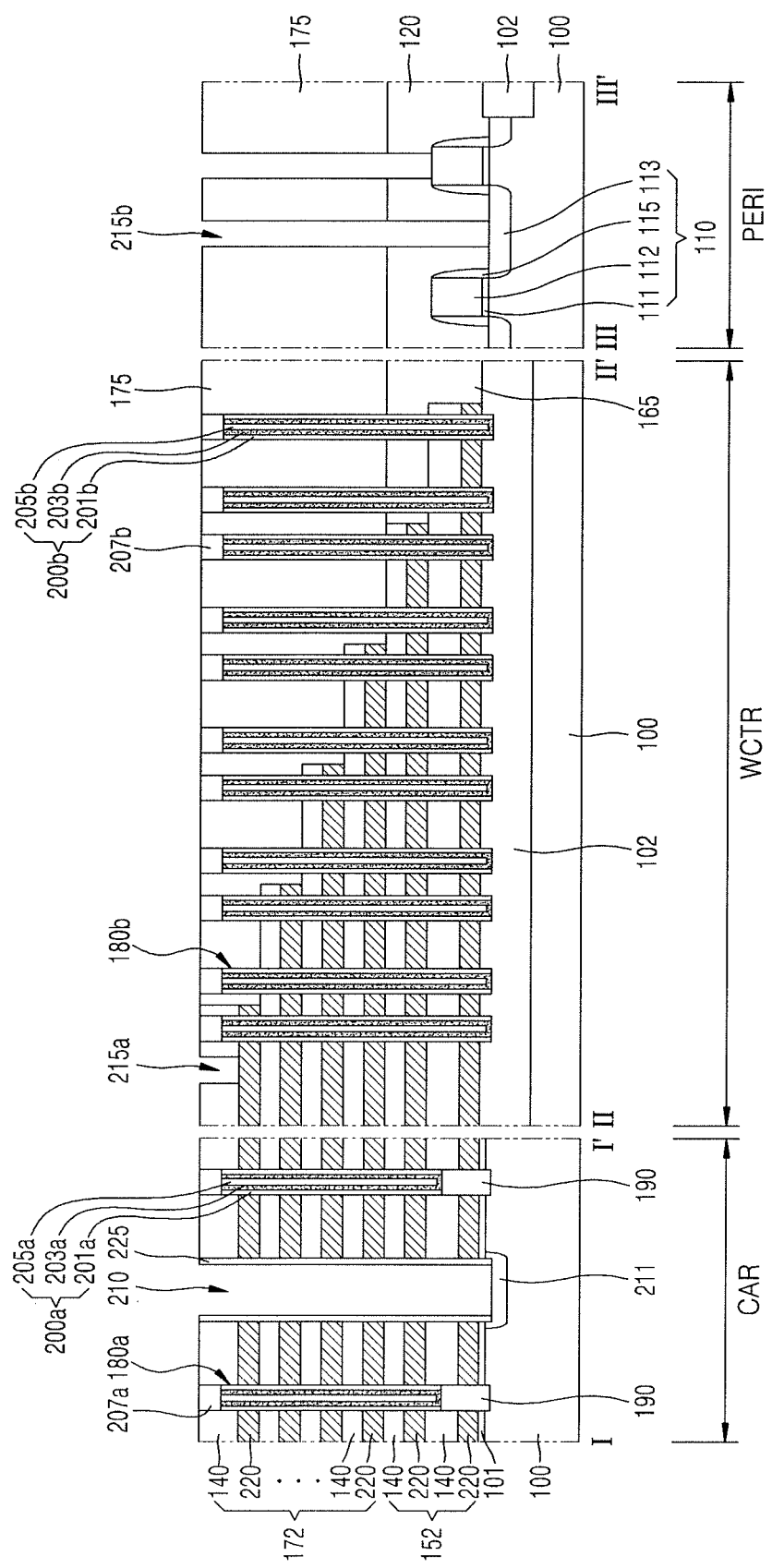
Figure 5Q:
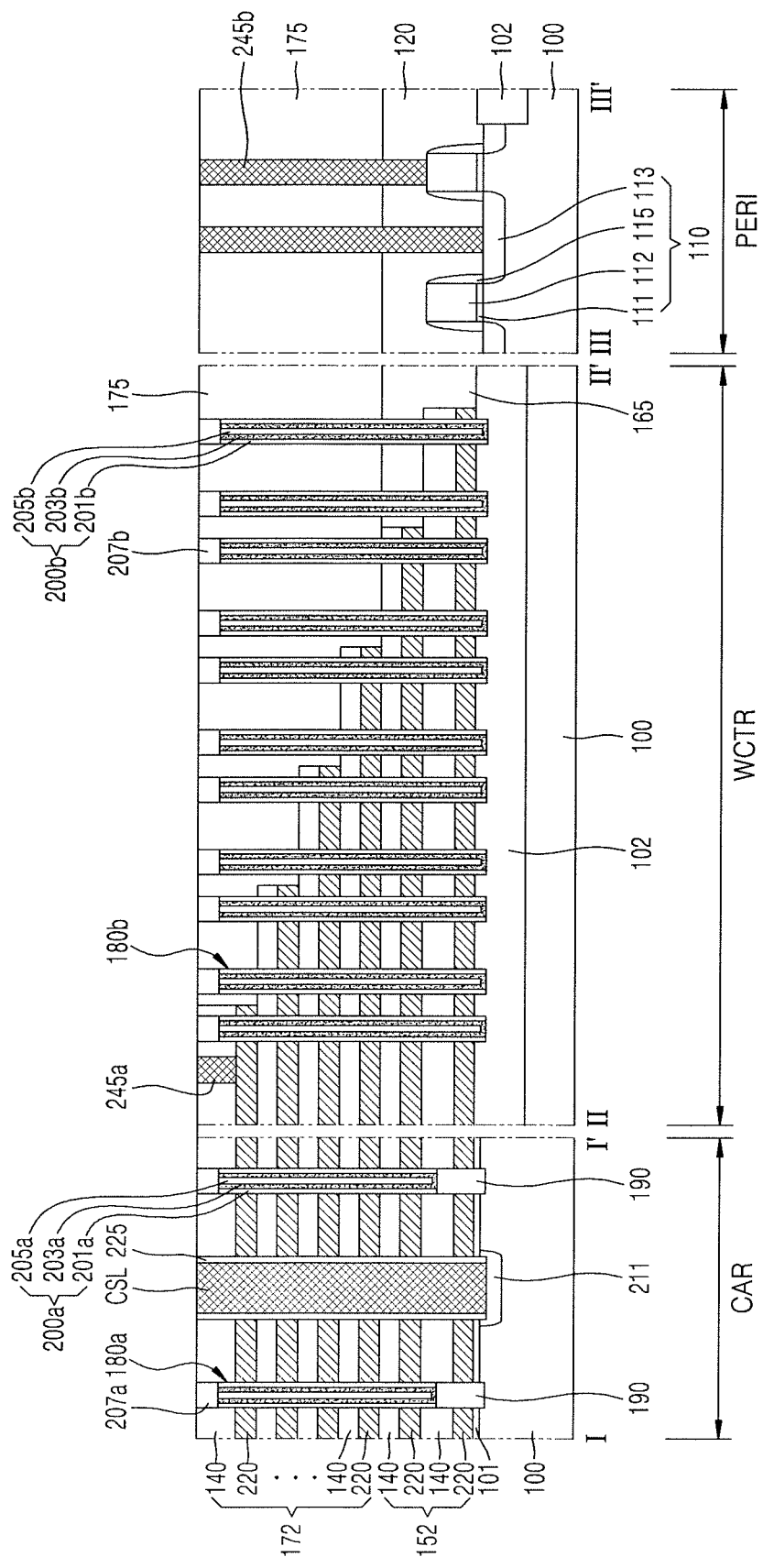
Figure 5R:
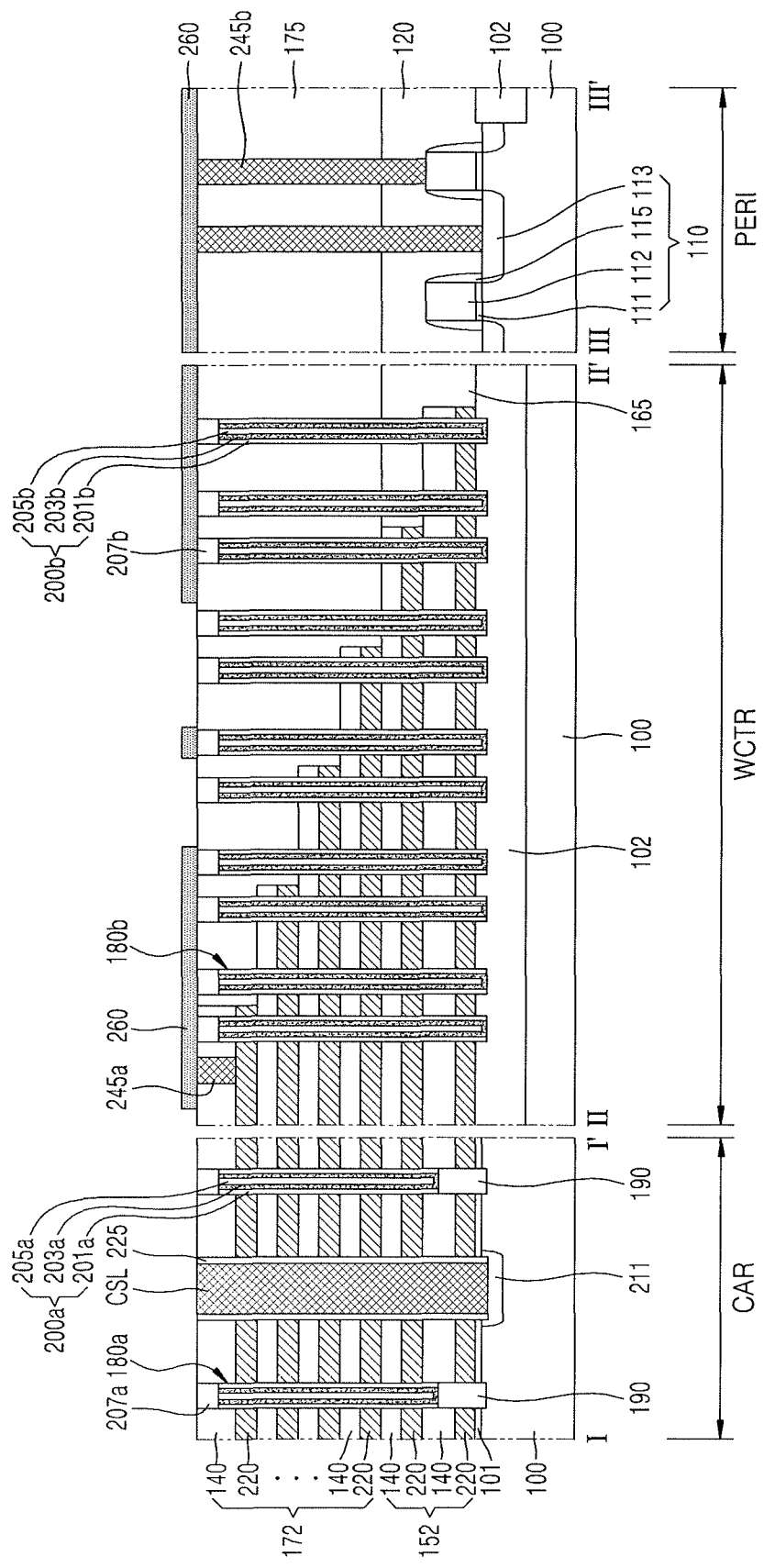
Figure 5S:
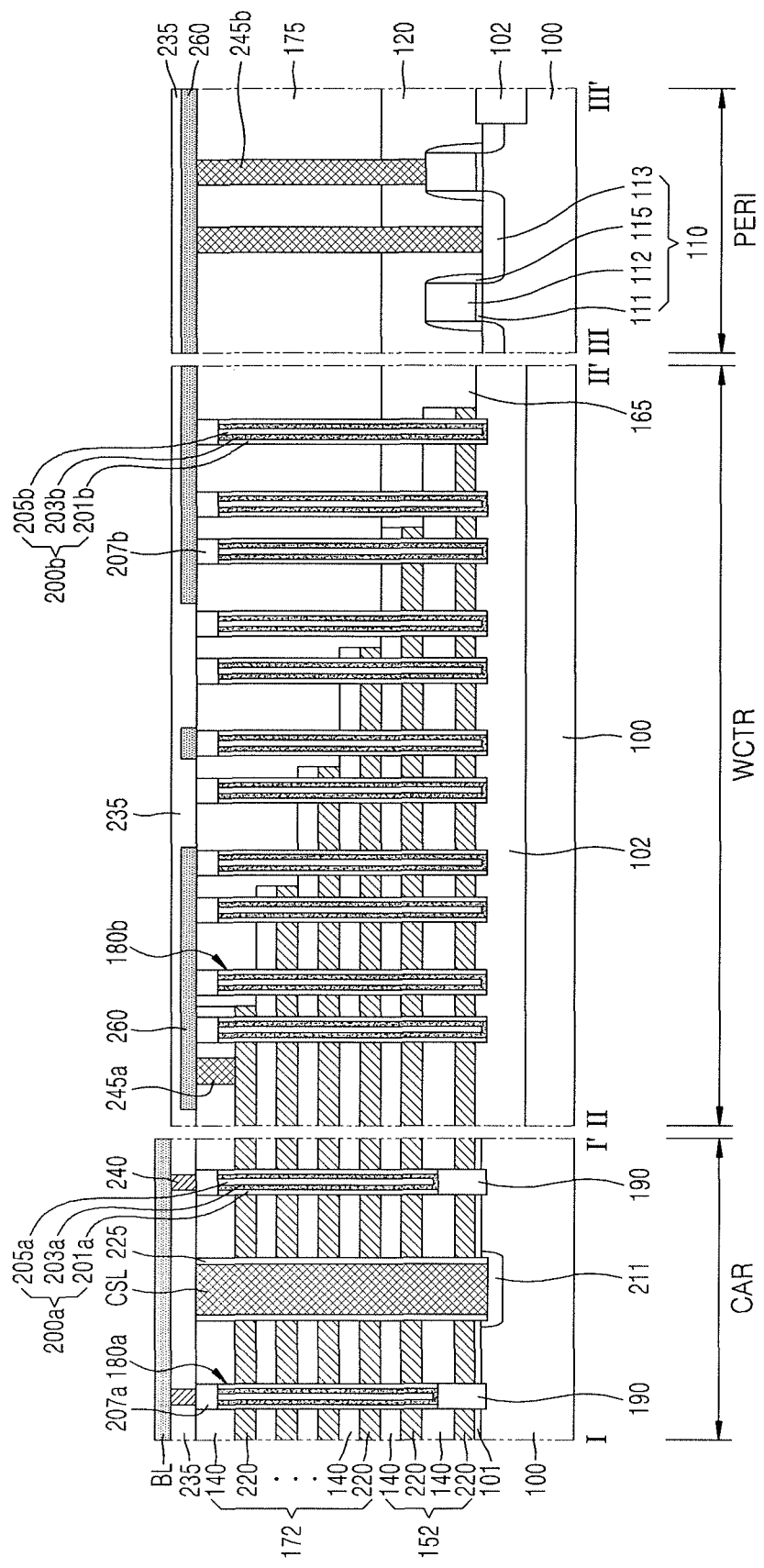

FIGS. 5A to 5S show cross-sectional views taken along lines I-I', and illustrated in FIG. 3A to explain stages in a method of fabricating a vertical memory device according to an example embodiment.

Referring to FIG. 5A, the device isolation film 102 may be formed in the substrate 100 to define an active region. The device isolation film 102 may be formed by performing a shallow trench isolation (STI) process. The STI process may include forming isolation trenches in the substrate 100 and filling the isolation trenches with an insulating material, e.g., silicon oxide. The substrate 100 may include a material having semiconductor characteristics, e.g., a silicon wafer. The substrate 100 may include the cell array region CAR, the peripheral circuit region PERI, and the word line contact region WCTR.

Referring to FIG. 5B, the peripheral transistors 110 may be formed in the peripheral circuit region PERI. Each of the peripheral transistors 110 may include the peripheral gate electrode 112, the peripheral gate insulating pattern 111, the source/drain region 113, and the gate spacers 115. The peripheral insulating film 120 and a peripheral sacrificial film 125 may be formed to cover the substrate 100 in the peripheral circuit region PERI.

In one example embodiment, forming of peripheral circuits may include forming a word line driver, which has been described in connection with FIG. 1, a sense amplifier, a low decoder, a column decoder, and a control circuit. In one embodiment, as illustrated in FIG. 5B, the peripheral transistors 110 constituting peripheral circuits may be formed on the substrate 100 in the peripheral circuit region PERI in the following manner. A peripheral gate insulating film and a peripheral gate film are sequentially stacked on the substrate 100. The stack structure of the peripheral gate insulating film and the peripheral gate film are patterned to form the peripheral gate electrodes 112 and the peripheral gate insulating patterns 111. The peripheral gate electrodes 112 may be formed by using, e.g., impurity-doped poly silicon or a metal material. The peripheral gate insulating pattern 111 may include, e.g., silicon oxide that is formed by a thermal oxidation process. Then, the source/drain region 113 and the gate spacer 115 may be formed on or in a portion of the substrate 100 exposed by the peripheral gate electrodes 112.

The peripheral insulating film 120 may be formed by providing an insulating material on the surface of the substrate 100 and planarizing the resultant structure. In one embodiment, the peripheral insulating film 120 may include, e.g., silicon oxide. The peripheral sacrificial film 125 may be provided on the peripheral insulating film 120. The peripheral sacrificial film 125 may include a material having etch selectivity with respect to the peripheral insulating film 120. In one embodiment, the peripheral sacrificial film 125 may include, e.g., silicon nitride, silicon oxynitride, silicon carbide, and silicon oxy carbide.

The peripheral insulating film 120 and the peripheral sacrificial film 125 may be patterned to remain only within the peripheral circuit region PERI. Accordingly, the peripheral insulating film 120 and the peripheral sacrificial film 125 may expose the substrate 100 corresponding to the cell array region CAR and the device isolation film 102 corresponding to the word line contact region WCTR.

Referring to FIG. 5C, a bottom stack structure 150 may be formed on the surface of the substrate 100 with the peripheral transistors 110 formed thereon. In example embodiments, the bottom stack structure 150 may be formed in the cell array region CAR, the word line contact region WCTR, and the peripheral circuit region PERI. The bottom stack structure 150 may be conformal to the surface of the substrate 100 with the peripheral insulating film 120 and the peripheral sacrificial film 125 thereon. The bottom stack structure 150 may cover a side wall of the peripheral insulating film 120 and a top surface of the peripheral sacrificial film 125.

The bottom stack structure 150 may include the interlayer insulating films 140 and a plurality of sacrificial films 130. The interlayer insulating films 140 and the sacrificial films 130 may be alternately, repeatedly stacked by a deposition process.

The interlayer insulating films 140 may each include a material that shows high etch selectivity with respect to a material in the sacrificial films 130 during wet etch. In one embodiment, the interlayer insulating films 140 may include at least one of, e.g., silicon oxide and silicon nitride, and the sacrificial films 130 may be selected from, e.g., a silicon film, a silicon oxide film, a silicon carbide, and a silicon nitride film, each having etch selectivity with respect to the interlayer insulating films 140.

A cell sacrificial film 145 may be formed on a top portion of the bottom stack structure 150. The cell sacrificial film 145 may include the same material as that in the peripheral sacrificial film 125. The cell sacrificial film 145 may include an insulating material that has etch selectivity with respect to the interlayer insulating films 140 or sacrificial films 130. In one embodiment, the cell sacrificial film 145 may include at least one of, e.g., silicon, silicon oxide, silicon oxynitride, silicon carbide, and silicon oxy carbide. In example embodiments, when the cell sacrificial film 145 is formed on the interlayer insulating films 140 each including a silicon oxide film, the sacrificial films 130 may be formed by using a silicon nitride film.

Before forming the bottom stack structure 150, the bottom gate insulating film 101 including a thermal oxidation film may be formed on the substrate 100. Since the bottom gate insulating film 101 is formed by a thermal oxidation process, the bottom gate insulating film 101 may be formed in the cell array region CAR exposing the surface of the substrate 100, and a thickness of the bottom gate insulating film 101 in the first direction (z direction) may be less than that of each of the interlayer insulating films 140.

Referring to FIG. 5D, the bottom stack structure 150 is patterned to form a bottom cell structure 152 on the substrate 100 in the cell array region CAR. The bottom cell structure 152 may have a stair-like structure obtained by patterning the bottom stack structure 150 a plurality of times. The bottom cell structure 152 may extend from the cell array region CAR to the word line contact region WCTR and may have a stair-shaped contact portion. As described above, since the bottom cell structure 152 has a stair-like structure, ends of the interlayer insulating films 140 and sacrificial films 130 may be located in the word line contact region WCTR. The interlayer insulating films 140 and the sacrificial films 130 may have a smaller area in a direction being away from the substrate 100. In other words, away from the substrate 100, side surfaces of the sacrificial films 130 and interlayer insulating films 140 may be farther away from the peripheral circuit region PERI.

In one example embodiment, due to the patterning process of the bottom stack structure 150, a portion of the device isolation film 102 in the word line contact region WCTR being adjacent to the peripheral circuit region PERI may be exposed. In one embodiment, due to the patterning of the bottom stack structure 150, the peripheral sacrificial film 125 and the peripheral insulating film 120 in the peripheral circuit region PERI may be exposed.

Referring to FIG. 5E, a bottom insulating film 160 covering the bottom cell structure 152, the device isolation film 102, the peripheral sacrificial film 125, and the peripheral insulating film 120 may be formed.

The bottom insulating film 160 may be formed by chemical mechanical deposition (CVD), having a conformal structure to the resultant structure on the substrate 100 in the cell array region CAR, the word line contact region WCTR, and the peripheral circuit region PERI. The bottom insulating film 160 may be formed by using a material that has etch selectivity with respect to the sacrificial films 130 and cell sacrificial film 145 of the bottom cell structure 152, and the peripheral sacrificial film 125.

In one embodiment, the bottom insulating film 160 may be the top insulating film 175 and the top interlayer insulating film 235. The bottom insulating film 160 may include, e.g., silicon nitride, silicon oxynitride, or a material having low permittivity.

Referring to FIG. 5F, the bottom insulating film 160 may be planarized by a planarizing process using the cell sacrificial film 145 and the peripheral sacrificial film 125 as a planarization stopper. Due to the planarizing process, local steps of the bottom insulating film 160 may be removed, thereby forming a planarized bottom insulating pattern 165 between the bottom cell structure 152 and the peripheral insulating film 120.

The bottom insulating film 160 may be planarized by, e.g., CMP. When the CMP process is performed on the bottom insulating film 160, the cell sacrificial film 145 may prevent etching of the interlayer insulating film 140 disposed thereunder, and the peripheral sacrificial film 125 may prevent etching of the peripheral insulating film 120.

Referring to FIG. 5G, the cell sacrificial film 145 and the peripheral sacrificial film 125 may be removed. Accordingly, the bottom cell structure 152, the bottom insulating pattern 165, and the peripheral insulating film 120 may have a common top surface.

In one embodiment, the cell sacrificial film 145 and the peripheral sacrificial film 125 may be removed by an anisotropic or isotropic etch process using an etch recipe that has etch selectivity with respect to the interlayer insulating films 140 of the bottom cell structure 152, the bottom insulating pattern 165, and the peripheral insulating film 120. In example embodiments, when the cell sacrificial film 145 and the peripheral sacrificial film 125 each includes a silicon nitride film, an etchant including a phosphoric acid may be used for an isotropic etch process.

Referring to FIG. 5H, a top stack structure 170 may be formed on the bottom cell structure 152, the bottom insulating pattern 165, and the peripheral insulating film 120. Like the bottom stack structure 150 (see FIG. 5C), the top stack structure 170 may include a plurality of interlayer insulating films 140 and a plurality of sacrificial films 130, and may be formed over the surface of the substrate 100. The interlayer insulating films 140 and the sacrificial films 130 may be alternately, repeatedly stacked by a deposition process.

Referring to FIG. 5I, the top stack structure 170 may be patterned to form a top cell structure 172 on the bottom cell structure 152. The top cell structure 172 may be formed by patterning the top stack structure 170 a plurality of times. Due to the patterning of the top stack structure 170, the top stack structure 170 is removed from the peripheral circuit region PERI and the word line contact region WCTR, thereby exposing the bottom insulating pattern 165 and the peripheral insulating film 120.

The top cell structure 172 may extend from the cell array region CAR to the word line contact region WCTR, and may have a stair-shaped contact portion. In the word line contact region WCTR, a contact portion of the top cell structure 172 and a contact portion of the bottom cell structure 152 may each have a stair-like shape. The contact portion of the top cell structure 172 contacts the first wiring plug 245a (see FIG. 5Q) that is to be formed in the subsequent process, and is electrically connected to the conductive lines 260. In an example embodiment, in the cell array region CAR, the number of sacrificial films 130 constituting the bottom cell structure 152 and the top cell structure 172 may be the same as the number of gate electrodes 220 vertically stacked in the cell array region CAR.

In one example embodiment, the thickness of each of the sacrificial films 130 of the bottom and top cell structures 152 and 172 may be identical, except that, from among the sacrificial films 130, the uppermost sacrificial film and the lowermost sacrificial film may have greater thicknesses than the other sacrificial films.

However, the number of films constituting the bottom and top cell structures 152 and 172, the thickness of each of the films, and a material that forms each of the films are not limited to the description above and related drawings. That is, the numbers, the thicknesses, and the materials may vary according to the kind of applied products, electrical characteristics of a memory cell transistor, and efficiency or technical difficulties in patterning the bottom cell structures 152 and the top cell structures 172.

Referring to FIG. 5J, the top insulating film 175 may be formed on the substrate 100 in the peripheral circuit region PERI and the word line contact region WCTR. The top insulating film 175 may be formed by using a material that has etch selectivity with respect to the sacrificial films 130 when the sacrificial films 130 of the bottom and top cell structures 152 and 172 are removed. The top insulating film 175 may be formed by, e.g., physical vapor deposition (PVD), chemical vapor deposition (CVD), sub-atmospheric CVD (SACVD), low pressure CVD (LPCVD), plasma enhanced CVD (PECVD), or high density plasma CVD (HDP CVD). By these deposition processes, the top insulating film 175 may be provided to cover the structure on the substrate 100, that is, the structure that has been explained in connection with FIG. 5I, in the cell array region CAR, the word line contact region WCTR, and the peripheral circuit region PERI.

Thereafter, a planarization process may be performed on the top insulating film 175. As a result, the planarized top insulating film 175 may expose the top surface of the uppermost interlayer insulating film 140. The top insulating film 175 may include a material that is substantially the same as the bottom insulating film 160.

Referring to FIG. 5K, the channel holes 180a may be formed in the cell array region CAR and the dummy holes 180b may be formed in the word line contact region WCTR, and the semiconductor pattern 190 may be formed to fill a bottom portion of each of channel holes 180a. In one example embodiment, forming the channel holes 180a may include forming a mask pattern on the top cell structure 172, and anisotropically, continuously etching the top and bottom cell structures 172 and 152 and the bottom gate insulating film 101 by using a mask pattern as an etch mask until the top surface of the substrate 100 is exposed. The channel holes 180a may expose side surfaces of the sacrificial films 130 and the interlayer insulating films 140, and may pass through the bottom gate insulating film 101 to expose the top surface of the substrate 100. In one example embodiment, when the channel holes 180a are formed, the top surface of the substrate 100 exposed by the channel holes 180a is over-etched to form a recess having a predetermined depth. The top surface of the substrate 100 corresponds to an active region of the cell array region CAR.

In one example embodiment, forming the dummy holes 180b may include anisotropic, continuous etching of the top insulating film 175 and the top and bottom cell structures 172 and 152 by using a mask pattern as an etch mask until the device isolation film 102 of the substrate 100 is exposed. The dummy holes 180b may pass through the top insulating film 175, the sacrificial films 130, and the interlayer insulating films 140 to expose the device isolation film 102 of the substrate 100. In one example embodiment, when the dummy holes 180b are formed, a portion of the device isolation film 102 exposed by the dummy holes 180b may be over-etched to form a recess having a predetermined depth. The channel holes 180a and the dummy holes 180b may be formed at the same time by anisotropic etching.

In one example embodiment, the semiconductor patterns 190 filling the bottom portion of each of the channel holes 180a may be formed by a SEG process using the top surface of the substrate 100 exposed by the channel holes 180a as a seed. However, the semiconductor patterns 190 are not formed on the device isolation film 102 exposed by the dummy holes 180b. This is because the device isolation film 102 includes an insulating film, e.g., silicon oxide film, and cannot be used as a seed for a SEG process. Accordingly, the semiconductor patterns 190 may be formed only within the channel holes 180a in the cell array region CAR. The semiconductor patterns 190 may include a monocrystalline silicon or monocrystalline silicon-germanium. In one or more embodiments, the semiconductor patterns 190 may include a doped impurity ion. Top surfaces of the semiconductor patterns 190 may lie at a higher level than the lowermost sacrificial film 130.

Referring to FIG. 5L, the channel structures 200a and the contact pads 207a may be formed in the channel holes 180a on the semiconductor patterns 190. Simultaneously, the dummy channel structures 200b and the dummy contact pads 207b may be formed on the device isolation film 102 exposed by the dummy holes 180b.

Each of the channel structures 200a may include the first dielectric film pattern 201a, the first vertical channel pattern 203a, and the first filling insulating film pattern 205a, which are sequentially stacked. The channel structures 200a may contact the semiconductor patterns 190 and may be electrically connected to the substrate 100. Bottom surfaces of the channel structures 200a may lie at a higher level than the top surface of the lowermost sacrificial film, but embodiments are not limited thereto.

Each of the dummy channel structures 200b may include the second dielectric pattern 201b, the second vertical channel pattern 203b, and the second filling insulating film pattern 205b, which are sequentially stacked. The dummy channel structures 200b may contact the device isolation film 102 through the lowermost sacrificial film 130. Accordingly, the dummy channel structures 200b may be vertically spaced apart from the substrate 100 with the device isolation film 102 therebetween. That is, the dummy channel structures 200b may be electrically insulated from the substrate 100 by the device isolation film 102. Bottom surfaces of the dummy channel structures 200b may lie at a lower level than the bottom surface of the sacrificial film 130. In one or more embodiments, bottom surfaces of the dummy channel structures 200b may lie at a lower level than bottom surfaces of the channel structures 200a.

The first and second dielectric patterns 201a and 201b may each have a pipe shape, and may be respectively formed in the channel holes 180a and the dummy holes 180b. The first and second dielectric patterns 201a and 201b may each include a plurality of insulating films. In one embodiment, each of the first and second dielectric patterns 201a and 201b may include a plurality of films including, e.g., a silicon oxide film, a silicon nitride film, a silicon oxynitride film, and a high-dielectric film.

The first and second vertical channel patterns 203a and 203b may be formed to have a hollow cylindrical shape or a cup shape. Empty regions defined by the first and second vertical channel patterns 203a and 203b may be respectively filled with first and second filling insulating film patterns 205a and 205b. Each of the first and second vertical channel patterns 203a and 203b may include an impurity-doped semiconductor, or impurity-undoped intrinsic semiconductor. In one embodiment, a semiconductor material may include, e.g., silicon (Si), germanium (Ge), or a mixture thereof. The first and second filling insulating film patterns 205a and 205b may each be formed by using an insulating material having gap-fill characteristics. In one embodiment, each of the first and second filling insulating film patterns 205a and 205b may include, e.g., a high-density plasma oxide film, a spin-on-glass (SOG) film, or a CVD oxide film.

The contact pads 207a and the dummy contact pads 207b may be formed on the channel structures 200a and the dummy channel structures 200b, respectively. Each of the contact pads 207a and the dummy contact pads 207b may be formed by using impurity-doped poly silicon or a metal material.

Referring to FIG. 5M, a trench 210 vertically passing through the sacrificial films 130 and the interlayer insulating films 140 may be formed between adjacent channel structures 200a. The trench 210 may extend between the dummy channel structures 200b.

Forming of the trench 210 may include forming of a mask pattern defining where the trench 210 is to be formed on the top cell structure 172 and the top insulating film 175, and anisotropic-etching of the top and bottom cell structures 172 and 152 and the top insulating film 175 by using the mask pattern as an etch mask. The trench 210 may expose a portion of the top surface of the substrate 100 vertically through the interlayer insulating films 140, the sacrificial films 130, the top insulating film 175, and the bottom gate insulating film 101. The trench 210 may extend in parallel to the top surface of the substrate 100 in the cell array region CAR and the word line contact region WCTR. The trench 210 may be spaced from the channel structures 200a and the dummy channel structures 200b and may expose side walls of the top insulating film 175, the sacrificial films 130, the interlayer insulating films 140, and the bottom gate insulating film 101. In the plan view of the trench 210, the trench 210 may have a line shape, a bar shape, or a rectangular shape. The trench 210 may, by a vertical depth, expose the top surfaces of the substrate 100 and the device isolation film 102. In one example embodiment, when the trench 210 is formed, the top surfaces of the substrate 100 and the device isolation film 102 exposed by the trench 210 may be over-etched and recessed.

In one example embodiment, once the trench 210 is formed, the impurity region 211 may be locally formed on the substrate 100 exposed by the trench 210. During an ion implantation process for forming the impurity region 211, the bottom and top cell structures 152 and 172 having the trench 210 may be used as a mask. The impurity region 211 may have, like the horizontal shape of the trench 210, a line shape that extends in one direction. The impurity region 211 may overlap with a portion of a bottom portion of each of the bottom and top cell structures 152 and 172 due to diffusion of an impurity. The impurity region 211 may have a conductive type that is opposite to that of the substrate 100. For example, when the substrate 100 has an n-type conductivity, the impurity region may have a p-type conductivity, and when the substrate 100 has p-type conductivity, the impurity region may have an n-type conductivity.

Referring to FIG. 5N, the sacrificial films 130 exposed by a side wall of the trench 210 are removed by performing an etch process, thereby forming side gap regions 213.

The etch process may include isotropic etching the sacrificial films 130 through the trench 210 by using an etchant that has etch selectivity with respect to the interlayer insulating films 140, the bottom gate insulating film 101, and the top insulating film 175. In one embodiment, when the sacrificial films 130 are each a silicon nitride film, and the interlayer insulating films 140, the bottom gate insulating film 101, and the top insulating film 175 are silicon oxide films, an etch process may be performed by using an etchant including a phosphoric acid. The side gap regions 213 may horizontally extend from the trench 210 in between the interlayer insulating films 140 to expose portions of the channel structures 200a and the dummy channel structures 200b.

Referring to FIG. 5O, the side gap regions 213 are filled with the gate electrodes 220.

Forming of the gate electrodes 220 may include forming of a conductive film in the side gap regions 213 and the trench 210, and removing the conductive film in the trench 210. The gate electrodes 220 may vertically be spaced from each other.

A conductive film may be formed by a deposition technique that provides excellent step coverage properties. Such a deposition technique may be, e.g., a chemical vapor deposition technique or an atomic layer deposition technique. Accordingly, the conductive film may fill the side gap regions 213. The conductive film may be formed conformally within the trench 210. The conductive film may include at least one of, e.g., doped polysilicon, tungsten, metal nitride films, and metal silicide. In one example embodiment, forming of the conductive film may include forming a metal film, e.g., metal nitride, and a metal film, e.g., tungsten, in a sequential manner. However, embodiments are not limited to a flash memory device, and accordingly, the conductive film may have other materials and structures than those described herein. Thereafter, the conductive film is removed from the trench 210, thereby allowing the gate electrodes 220 to be vertically spaced apart from each other.

In one embodiment, the gate electrodes 220 may be used as the string selection line SSL, the ground selection line GSL, and the word lines WL, which have been explained in connection with FIG. 2. In one embodiment, the uppermost layer and the lowermost layer of the gate electrodes 220 are respectively used as the string selection line SSL and the ground selection line GSL, and the remaining layers of the gate electrodes 220 between the uppermost layer and the lowermost layer may be used as the word lines WL. The string selection transistor SST may be formed where the string selection line SSL crosses the channel structures 200a, the ground selection transistor GST may be formed where the ground selection line GSL crosses the semiconductor pattern 190, and the memory cell transistors MCT may be formed where the word line WL crosses the channel structures 220a.

The insulating spacer 225 may be formed on the side wall of the trench 210. The insulating spacer 225 may be formed in such a manner that an insulating film for a spacer is provided on the surface of the substrate 100, and then, an anisotropic etch is performed on the gate electrodes 220 and the interlayer insulating films 140 in a direction vertical to the top surface of the substrate 100 until the impurity region 211 is exposed. The insulating spacer 225 may include, e.g., silicon oxide, silicon nitride, silicon oxy nitride, or other insulating materials.

Referring to FIG. 5P, a first contact hole 215a and a second contact hole 215b are respectively formed in the word line contact region WCTR and the peripheral circuit region PERI. The first contact hole 215a may expose a portion of a first gate electrode which is any one of the gate electrodes 220. The second contact hole 215b may expose a portion of top surfaces of the peripheral gate electrodes 112 of the peripheral transistors 110 and a portion of the top surface of the source/drain region 113.

Referring to FIG. 5Q, the common source line CSL, and the first and second wiring plugs 245a and 245b may be formed by filling the trench 210 and the first and second contact holes 215a and 215b with a, e.g., same, conductive material, e.g., tungsten, and performing an etch-back process or CMP thereon. As a result, the common source line CSL and the first and second wiring plugs 245a and 245b may have an identical composition, and top surfaces of the common source line CSL, and first and second wiring plugs 245a and 245b may lie at the same level, e.g., be substantially level and coplanar with each other. By forming the common source line CSL simultaneously with the first and second wiring plugs 245a and 245b, e.g., as opposed to sequentially, the amount of the conductive material consumed by, e.g., CMP, may be reduced.

In one example embodiment, forming each of the common source line CSL and the first and second wiring plugs 245a and 245b may include forming of a barrier metal film, e.g., a metal nitride film, and a metal film, e.g., a tungsten film, in a sequential manner. The common source line CSL may contact and be electrically connected to the impurity region 211. The common source line CSL may have a line shape that extends in one direction.

Referring to FIG. 5R, the conductive lines 260 may be formed on the dummy contact pads 207b and the first and second wiring plugs 245a and 245b in the word line contact region WCTR and the peripheral circuit region PERI, and may extend in parallel to the top surface of the substrate 100. Forming of a conductive line may include forming of a barrier metal film, e.g., a metal nitride film, and a metal film, e.g., a tungsten film, in a sequential manner. The conductive lines 260 may cross, e.g., overlap, at least a portion of a vertical extension of the dummy channel structures 200b and the dummy contact pads 207b.

Referring to FIG. 5S, the top interlayer insulating film 235 may be formed over the surface of the substrate 100, and the bit line plugs 240 and bit lines BL may be formed in the cell array region CAR. The bit line plugs 240 may be configured to contact the contact pads 207a formed on the channel structures 200a to be electrically connected to the channel structures 200a. The bit lines BL may be formed on the bit line plugs 240 and may cross the gate electrodes 220. Forming the bit line plugs 240 may include forming contact holes passing through the top interlayer insulating film 235 on the contact pad in the cell array region CAR and filling the contact holes with a conductive material. The bit line plugs 240 may include a metallic material, and the metallic material may include a barrier metal film, e.g., a metal nitride film, and a metal film, e.g., a tungsten film.

In one example embodiment, forming of the bit lines BL may include forming of a barrier metal film, e.g., a metal nitride film, and a metal film, e.g., a tungsten film, in a sequential manner.

Figure 6A:
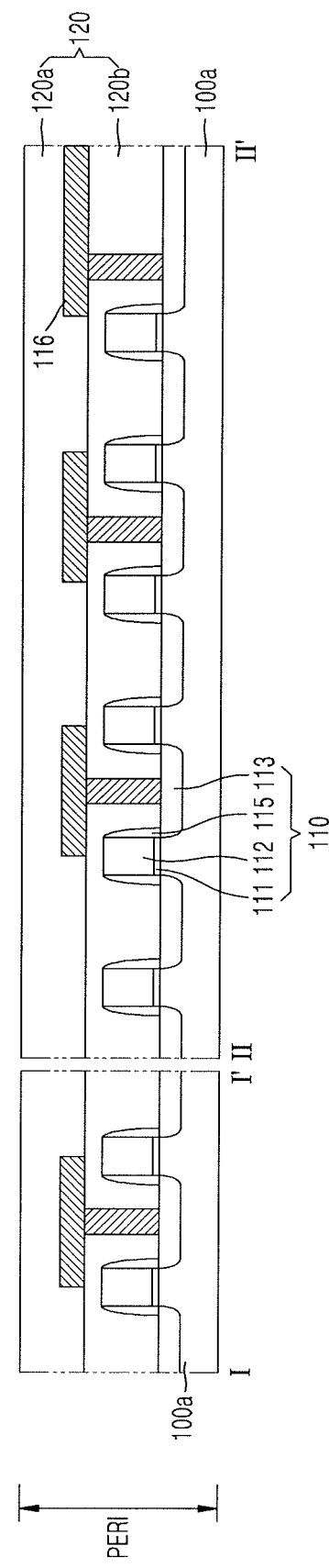
FIGS. 6A to 6E illustrate cross-sectional views taken along lines I-I' and II-II' in FIG. 4A to explain stages in a method of fabricating a vertical memory device according to another example embodiment.

FIGS. 6A to 6E show cross-sectional views taken along lines I-I' and II-II' illustrated in FIG. 4A to explain stages in a method of fabricating a vertical memory device according to another example embodiment Referring to FIG. 6A, the peripheral transistors 110 and the peripheral conductive lines 116 connecting the peripheral transistors 110 to each other may be formed on the first substrate 100a. The first substrate 100a may include a material having semiconductor characteristics, e.g., a silicon wafer. The first substrate 100a may include the peripheral circuit region PERI.

Each of the peripheral transistors 110 may include the peripheral gate insulating pattern 111, the peripheral gate electrodes 112, the source/drain region 113, and the gate spacer 115. The peripheral transistors 110 and the conductive lines 116 may be covered by the peripheral insulating film 120. The peripheral insulating film 120 may include the first peripheral insulating film 120b and the second peripheral insulating film 120a. The first peripheral insulating film 120b and the second peripheral insulating film 120a may each include a silicon oxide film.

Figure 6B:
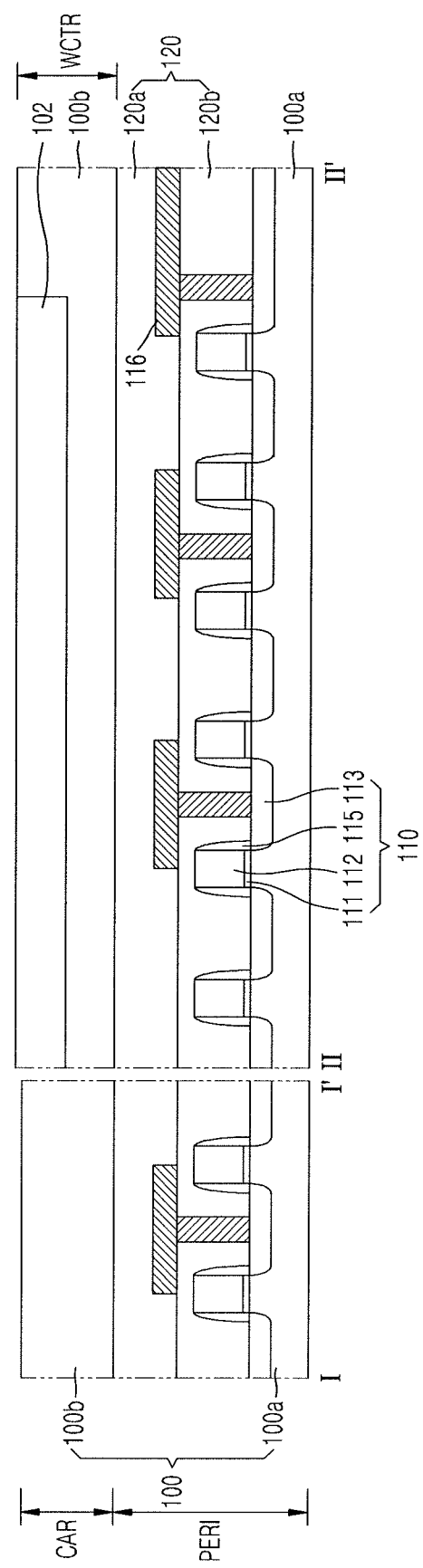

Referring to FIG. 6B, the second substrate 100b may be formed on the second peripheral insulating film 120b. The second substrate 100b may be formed by providing and monocrystallizing a material having semiconductor characteristics, for example, poly silicon or amorphous silicon. The second substrate 100b may include the cell array region CAR and the word line contact region WCTR. The device isolation film 102 may be formed in the second substrate 100b. The device isolation film 102 may be formed by a STI process. The STI process may include forming isolation trenches in the substrate 100b, and filling the isolation trenches with, for example, silicon oxide.

Figure 6C:
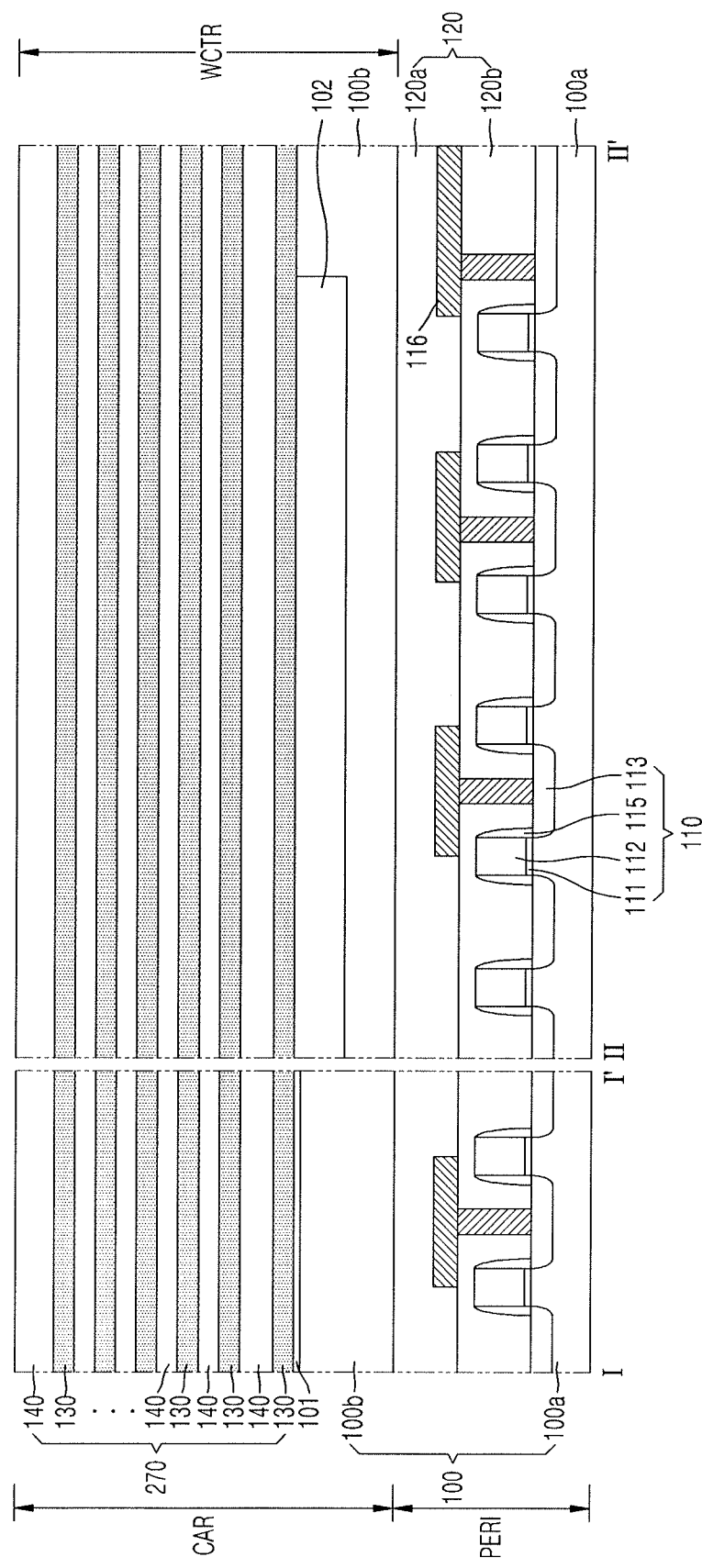

Referring to FIG. 6C, a stack structure 270 may be formed on the second substrate 100b. The stack structure 270 may include the interlayer insulating films 140 and the sacrificial films 130, which are sequentially, repeatedly stacked. Before the stack structure 270 is formed, the bottom gate insulating film 101 including a thermal oxidation film may be formed on a top surface of the second substrate 100b.

Figure 6D:
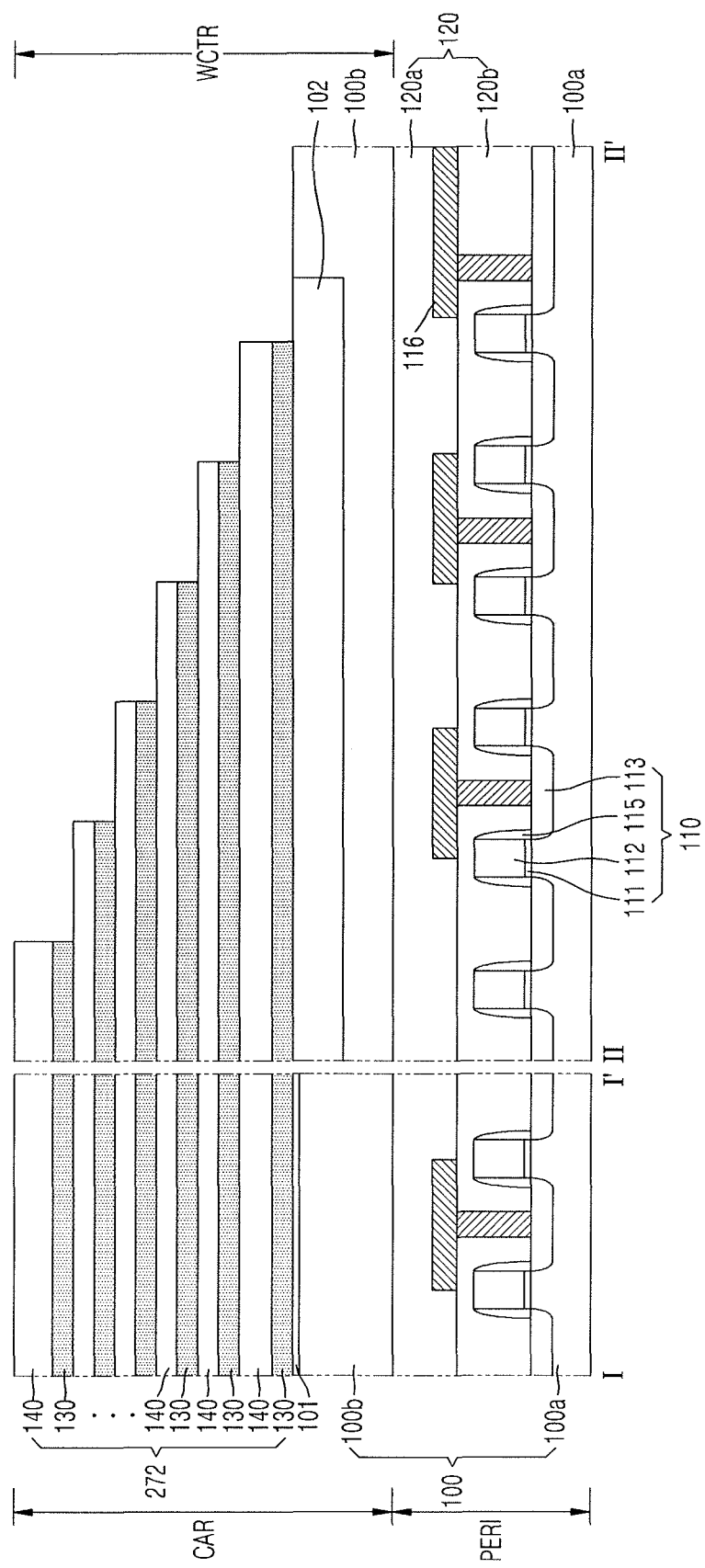

Referring to FIG. 6D, the stack structure 270 is patterned to form a cell structure 272 on a substrate 100b in the cell array region CAR. The cell structure 272 may be formed by patterning the stack structure 270 a plurality of times to form a stair-like structure. The cell structure 272 may extend from the cell array region CAR to the word line contact region WCTR, thereby forming a contact portion having a stair-like shape. Due to the forming of the cell structure 272 having a stair-like structure, ends of the interlayer insulating films 140 and the sacrificial films 130 may be located in the word line contact region WCTR.

Figure 6E:
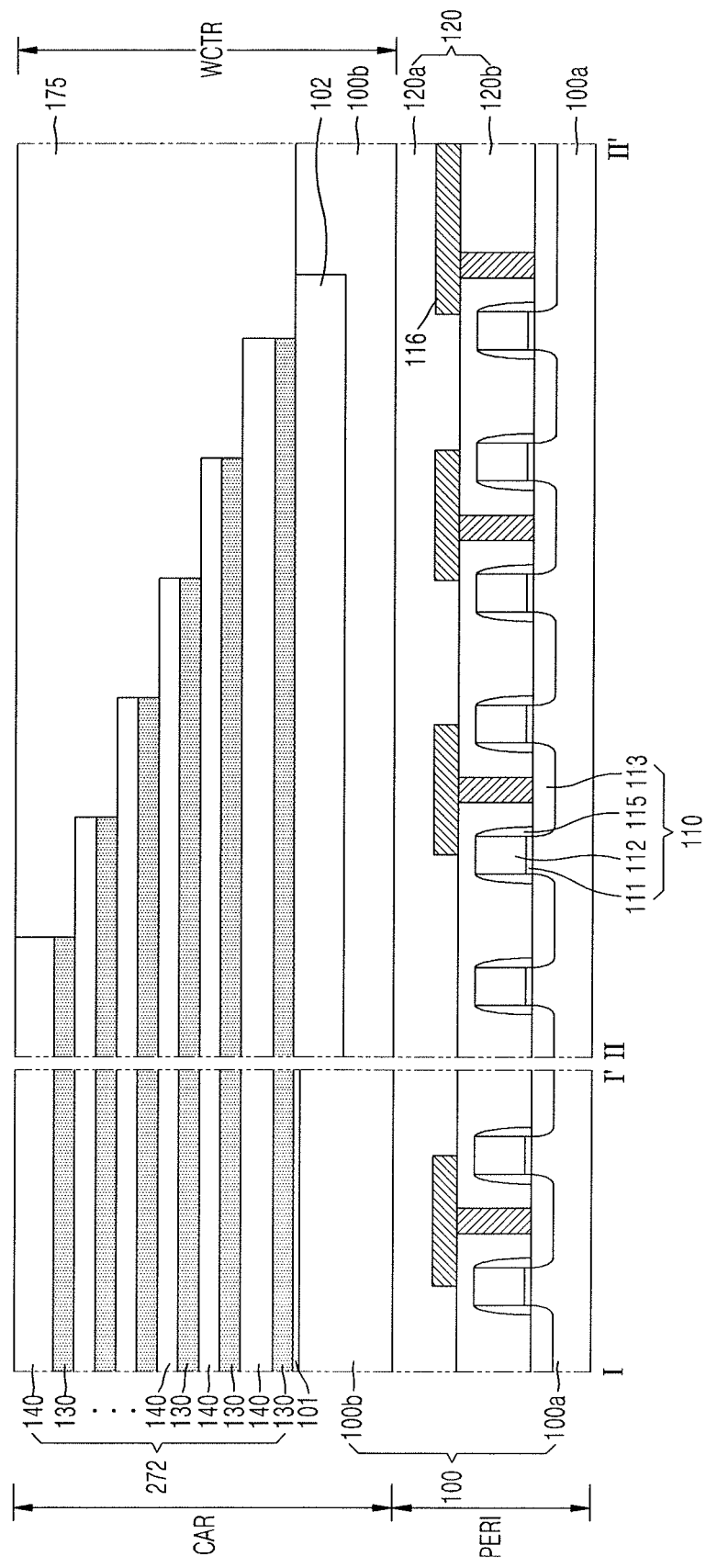

Referring to FIG. 6E, the top insulating film 175 may be formed on the second substrate 100b in the word line contact region WCTR.

The subsequent processes for forming a vertical memory are similar to those explained in connection with FIGS. 5K to 5S, and accordingly, will not be described in detail herein.

In the method of fabricating a vertical memory device as described above, the first and second wiring plugs 245a and 245b and the common source line CSL are simultaneously provided. Due to the simultaneous formation, an amount of conductive material used is minimized, and the vertical distance between the conductive lines 260 and the top surface of the substrate 100 is decreased, thereby providing a space for forming wiring in a subsequent process, and reducing the size of a vertical memory device, enabling miniaturization and integration.

In this regard, if the vertical distance between the bottom surfaces of the conductive lines 260 and the top surfaces of the dummy contact pads 207b formed on the dummy channel structures 200b were to be reduced, without the device isolation film 102 between the substrates 100 and the dummy channel structures 200b, the conductive lines 260 would be short-circuited with the substrates 1001 and 100b through the dummy contact pads 207b and the dummy channel structures 200b. However, in example embodiments, since the dummy holes 180b are formed on the device isolation film 102, the semiconductor patterns 190 formed by SEG may not be formed in the dummy holes 180b. Accordingly, the dummy channel structures 200b may be insulated from the substrates 100a and 100b, and the conductive lines 260 may be insulated from the substrates 100a and 100b. By doing so, the conductive lines 260 cross the vertical extension of the dummy channel structures 200b, and thus, a degree of freedom in designing a wiring may be increased.

By way of summation and review, embodiments provide a vertical memory device with a high degree of freedom in terms of wiring. Embodiments also provide a method of fabricating the vertical memory device. That is, a dummy channel is formed on a device isolation region, so the dummy channel is insulated from a substrate via the insulating material of the device isolation region. Accordingly, a metal line crossing the dummy channel may not be short-circuited with the substrate.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A vertical memory device, comprising:
    a substrate including a cell array region, a word line contact region, and a peripheral circuit region;
    gate electrodes extending substantially parallel to a top surface of the substrate on the cell array region and on the word line contact region, the gate electrodes being stacked on the substrate while being spaced apart from one another in a first direction, the first direction being substantially perpendicular to the top surface of the substrate;
    a channel structure through the gate electrodes in the first direction on the cell array region, the channel structure being electrically connected to the substrate;
    a dummy channel structure through the gate electrodes in the first direction on the word line contact region, the dummy channel structure being spaced apart from the substrate in the first direction;
    a conductive line extending substantially parallel to the top surface of the substrate on the peripheral circuit region and on the word line contact region, the conductive line being electrically connected to a first gate electrode of the gate electrodes;
    and a dummy contact pad between the dummy channel structure and the conductive line, the conductive line crossing at least a top surface of the dummy contact pad in a second direction perpendicular to the first direction, wherein the conductive line crosses at least a top surface of the dummy channel in the second direction, and wherein a bottom surface of the conductive line and a top surface of the dummy contact pad are in direct contact with each other.

2. The vertical memory device as claimed in claim 1, wherein a length of the channel structure in the first direction is less than a length of the dummy channel structure in the first direction.

3. The vertical memory device as claimed in claim 1, further comprising a semiconductor pattern electrically connected to the channel structure and the substrate, the semiconductor pattern being between the channel structure and the substrate.

4. The vertical memory device as claimed in claim 1, further comprising a device isolation film on the word line contact region to define an active region of the substrate, a bottom surface of the dummy channel structure being in contact with the device isolation film.

5. The vertical memory device as claimed in claim 1, further comprising an interlayer insulating film parallel to the top surface of the substrate on the cell array region and on the word line contact region, the interlayer insulating film being on an uppermost gate electrode of the gate electrodes, and a top surface of the interlayer insulating film and a bottom surface of the conductive line being at a same level.

6. The vertical memory device as claimed in claim 1, further comprising:
    a common source line through the gate electrodes in the first direction, the common source line extending substantially parallel to the top surface of the substrate on the cell array region and on the word line contact region in top view;
    a first wiring plug extending in the first direction to electrically connect the conductive line and the first gate electrode; and
    a second wiring plug extending in the first direction and to electrically connect the conductive line and a transistor in the peripheral circuit region,
    wherein each of the first wiring plug, the second wiring plug, and the common source line includes an identical composition.

7. The vertical memory device as claimed in claim 6, wherein a top surface of the first wiring plug, a top surface of second wiring plug, and a top surface of the common source line are at a same level.

8. The vertical memory device as claimed in claim 6, wherein a bottom surface of the conductive line and a top surface of the first wiring plug are at a same level.

9. The vertical memory device as claimed in claim 1, wherein the conductive line contacts the dummy contact pad.

10. A vertical memory device, comprising:
    a substrate with a cell array region and a word line contact region;

gate electrodes parallel to a top surface of the substrate on the cell array region and on the word line contact region, the gate electrodes being stacked and spaced apart from one another in a first direction perpendicular to the top surface of the substrate;

a channel structure through the gate electrodes in the first direction on the cell array region, the channel structure being electrically connected to the substrate;

a dummy channel structure through the gate electrodes in the first direction on the word line contact region, the dummy channel structure being spaced apart from the substrate in the first direction;

an insulating structure between the dummy channel structure and the substrate, such that an electrical route between the dummy channel structure and the substrate through the insulating structure is not formed; and a conductive line parallel to the top surface of the substrate on the word line contact region, the conductive line being electrically connected to a first gate electrode of the gate electrodes, wherein the conductive line is electrically connected to the dummy channel structure.

11. The vertical memory device as claimed in claim 10, further comprising a dummy contact pad electrically connecting the dummy channel structure with the conductive line, the dummy channel structure extending along the first direction from the insulating structure to the conductive line.

12. The vertical memory device as claimed in claim 11, wherein the conductive line is directly connected to the dummy contact pad.

13. The vertical memory device as claimed in claim 12, further comprising a wiring plug in the first direction and electrically connecting the conductive line with the first gate electrode, on the word line contact region, wherein a top surface of the wiring plug and a top surface of the dummy contact pad are at a same level.

14. The vertical memory device as claimed in claim 13, further comprising a common source line through the gate electrodes in the first direction, the common source line extending substantially parallel to the top surface of the substrate on the cell array region and on the word line contact region in top view, and the wiring plug and the common source line including an identical composition.

15. The vertical memory device as claimed in claim 14, wherein a top surface of the wiring plug and a top surface of the common source line are at a same level.

16. The vertical memory device as claimed in claim 14, wherein a bottom surface of the conductive line and a top surface of the wiring plug are at a same level.

17. The vertical memory device as claimed in claim 11, wherein a bottom surface of the conductive line and a top surface of the dummy contact pad are at a same level.

18. The vertical memory device as claimed in claim 10, wherein a length of the channel structure in the first direction is less than a length of the dummy channel structure in the first direction.

19. The vertical memory device as claimed in claim 10, further comprising a semiconductor pattern electrically connected to the channel structure and the substrate, the semiconductor pattern being between the channel structure and the substrate.

20. The vertical memory device as claimed in claim 10, further comprising an interlayer insulating film parallel to the top surface of the substrate in the cell array region and in the word line contact region, the interlayer insulating film being on an uppermost gate electrode of the gate electrodes, and a top surface of the interlayer insulating film and a bottom surface of the conductive line being at a same level.

* * * * *